United States Patent
Jung et al.

(10) Patent No.: US 8,603,646 B2
(45) Date of Patent: Dec. 10, 2013

(54) PYRROLE COMPOUND AND ORGANIC PHOTOELECTRIC DEVICE INCLUDING THE SAME

(75) Inventors: Sung-Hyun Jung, Uiwang-si (KR); Hyung-Sun Kim, Uiwang-si (KR); Ho-Jae Lee, Uiwang-si (KR); Eun-Sun Yu, Uiwang-si (KR); Mi-Young Chae, Uiwang-si (KR); Young-Hoon Kim, Uiwang-si (KR); Ja-Hyun Kim, legal representative, Bryeong (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 43 days.

(21) Appl. No.: 13/038,614

(22) Filed: Mar. 2, 2011

(65) Prior Publication Data

US 2011/0266527 A1 Nov. 3, 2011

Related U.S. Application Data

(63) Continuation of application No. PCT/KR2008/007908, filed on Dec. 31, 2008.

(30) Foreign Application Priority Data

Sep. 2, 2008 (KR) .................. 10-2008-0086360

(51) Int. Cl.
 *H01L 51/54* (2006.01)
 *C07D 401/10* (2006.01)
 *C07D 207/325* (2006.01)
(52) U.S. Cl.
 USPC ........... 428/690; 428/917; 313/504; 313/506; 548/445; 548/563
(58) Field of Classification Search
 None
 See application file for complete search history.

(56) References Cited

U.S. PATENT DOCUMENTS 6,780,950 B2 * 8/2004 Cho et al. .................. 526/258

FOREIGN PATENT DOCUMENTS

| JP | 2003-282270 A | 10/2003 |
| JP | 2004-071380 A | 3/2004 |

(Continued)

OTHER PUBLICATIONS

Translation for JP 2004-071380, which was published Mar. 2004.*

(Continued)

*Primary Examiner* — Dawn L. Garrett
(74) *Attorney, Agent, or Firm* — Lee & Morse, P.C.

(57) ABSTRACT

A pyrrole compound for an organic photoelectric device and an organic photoelectric device including the same, the pyrrole compound being represented by the following General Formula 1:

General Formula 1

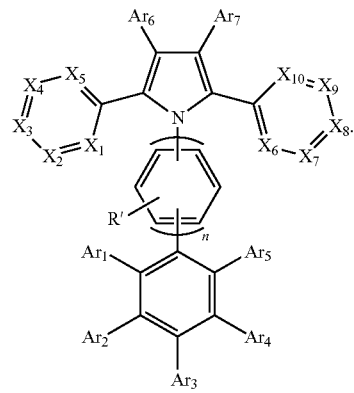

20 Claims, 8 Drawing Sheets

(56) References Cited

FOREIGN PATENT DOCUMENTS

| JP | 2004-146368 A | | 5/2004 |
|----|---------------|---|--------|
| JP | 2004-214050 A | | 7/2004 |
| JP | 2004-253298 A | | 9/2004 |
| JP | 2005-093159 A | | 4/2005 |
| JP | 2005-232159 A | | 9/2005 |
| JP | 2007-049055 A | | 2/2007 |
| KR | 2011064726 | * | 6/2011 |

OTHER PUBLICATIONS

Translation for JP 2004-146368, which was published May 2004.*
Translation for JP 2005-232159, which was published Sep. 2005.*

Baldo, et al.; Very high-efficiency green organic light-emitting devices based on electrophosphoresence; Applied Physics Letters; Jul. 5, 1999; pp. 4-6; vol. 75, No. 1; American Institute of Physics; United States.

O'Brien, et al.; Improved energy transfer in electrophosphorescent devices; Applied Physics Letters; Jan. 18, 1999; pp. 442-444; vol. 74, No. 3; American Institute of Physics; United States.

Tang, et al.; Organic electroluminescent diodes; Applied Physics Letters; Sep. 21, 1987; pp. 913-915; vol. 51, No. 12; American Institute of Physics; United States.

European Search Report in EP 08876886.6-1218/2321377, dated Mar. 19, 2012.

International Search Report in PCT/KR2008/007908, dated Aug. 18, 2009 (Jung, et al.).

* cited by examiner

PYRROLE COMPOUND AND ORGANIC PHOTOELECTRIC DEVICE INCLUDING THE SAME

CROSS-REFERENCE TO RELATED APPLICATION

This application is a continuation of pending International Application No. PCT/KR2008/007908, entitled "Pyrrole Compounds and Organic Photoelectric Device Including the Same," which was filed on Dec. 31, 2008, the entire contents of which are hereby incorporated by reference.

BACKGROUND

1. Field

Embodiments relate to a pyrrole compound and an organic photoelectric device including the same.

2. Description of the Related Art

Organic photoelectric devices have attracted attention to as a next generation display device. The organic photoelectric devices may be operated at a low voltage and may have benefits compared to a thin film transistor-liquid crystal display (TFT-LCD), e.g., small thickness, good optical viewing angle, a rapid response speed, and the like. In addition, the organic photoelectric devices may have the same or better image quality than that of a TFT-LCD in a medium or small size. Further, since organic photoelectric devices may be manufactured using a simple process, they may have an advantage in price competitiveness.

SUMMARY

Embodiments relate to a pyrrole compound and an organic photoelectric device including the same.

The embodiments may be realized by providing a pyrrole compound for an organic photoelectric device, the pyrrole compound being represented by the following General Formula 1:

General Formula 1

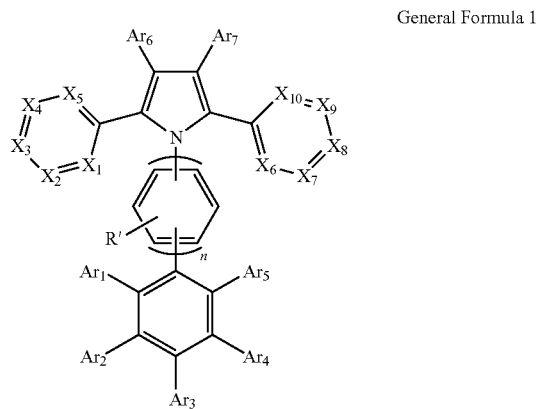

wherein, in General Formula 1, R' includes at least one of hydrogen and a C1 to C6 alkyl, $Ar_1$ to $Ar_5$ each independently include at least one of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, provided that $Ar_1$ to $Ar_5$ are neither a pyridyl group nor a pyrrole derivative group, $Ar_6$ and $Ar_7$ each independently include at least one of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, $X_1$ to $X_{10}$ each independently include one of CR" and N, where R" includes at least one of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, and n is an integer of 1 or 2.

In the General Formula 1, $Ar_1$ to $Ar_5$ may each independently include at least one of a substituted or unsubstituted carbazolyl; a substituted or unsubstituted arylamino; a substituted or unsubstituted phenyl; a substituted or unsubstituted tolyl; a substituted or unsubstituted naphthyl; a substituted or unsubstituted stilbenzyl; a substituted or unsubstituted fluorenyl; a substituted or unsubstituted anthracenyl; a substituted or unsubstituted terphenyl; a substituted or unsubstituted pyrenyl; a substituted or unsubstituted diphenylanthracenyl; a substituted or unsubstituted dinaphthylanthracenyl; a substituted or unsubstituted pentacenyl; a substituted or unsubstituted bromophenyl; a substituted or unsubstituted hydroxyphenyl; a substituted or unsubstituted thienyl; a substituted or unsubstituted azobenzenyl; and a substituted or unsubstituted ferrocenyl, and $Ar_6$ and $Ar_7$ may each independently include at least one of a substituted or unsubstituted carbazolyl; a substituted or unsubstituted arylamino; a substituted or unsubstituted phenyl; a substituted or unsubstituted tolyl; a substituted or unsubstituted naphthyl; a substituted or unsubstituted stilbenzyl; a substituted or unsubstituted fluorenyl; a substituted or unsubstituted anthracenyl; a substituted or unsubstituted terphenyl; a substituted or unsubstituted pyrenyl; a substituted or unsubstituted diphenylanthracenyl; a substituted or unsubstituted dinaphthylanthracenyl; a substituted or unsubstituted pentacenyl; a substituted or unsubstituted bromophenyl; a substituted or unsubstituted hydroxyphenyl; a substituted or unsubstituted thienyl; a substituted or unsubstituted pyridyl; a substituted or unsubstituted azobenzenyl; and a substituted or unsubstituted ferrocenyl.

In the General Formula 1, $Ar_1$ to $Ar_7$ may each independently include at least one moiety represented by the following Chemical Formulae 1 to 29:

[Chemical Formula 1]

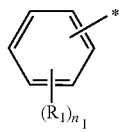

[Chemical Formula 2]

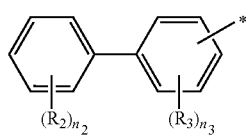

[Chemical Formula 3]

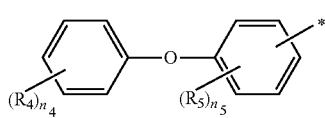

[Chemical Formula 4]

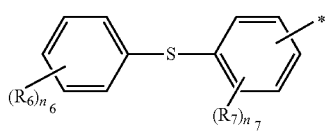

[Chemical Formula 5]

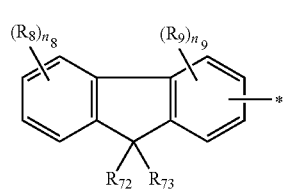

-continued

[Chemical Formula 6]

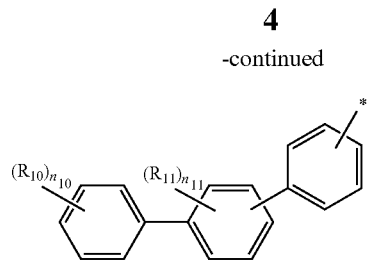

[Chemical Formula 7]

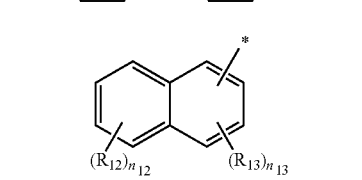

[Chemical Formula 8]

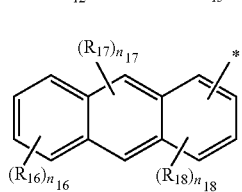

[Chemical Formula 9]

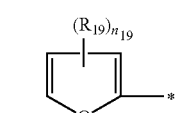

[Chemical Formula 10]

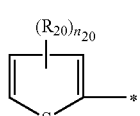

[Chemical Formula 11]

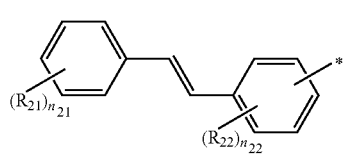

[Chemical Formula 12]

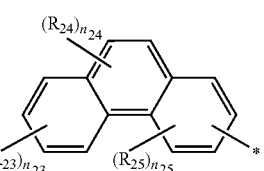

[Chemical Formula 13]

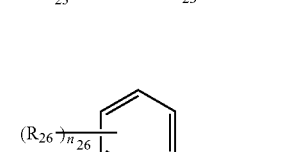

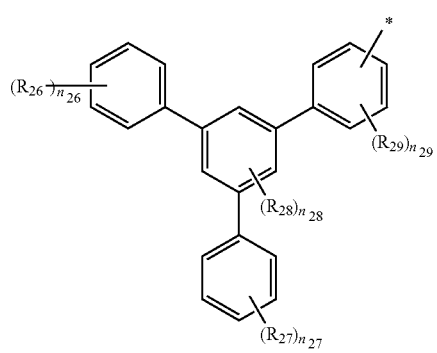

[Chemical Formula 14]

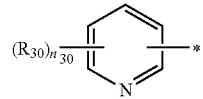

[Chemical Formula 15]
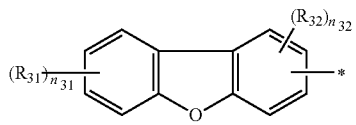
[Chemical Formula 16]
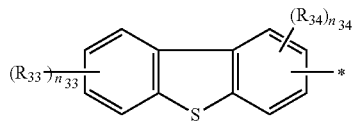
[Chemical Formula 17]
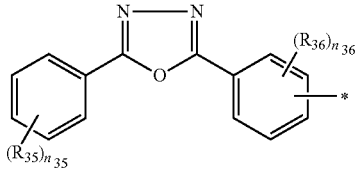
[Chemical Formula 18]
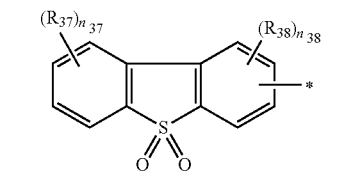
[Chemical Formula 19]
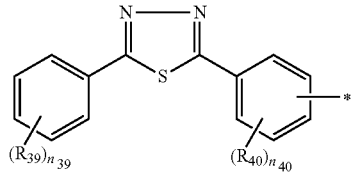
[Chemical Formula 20]
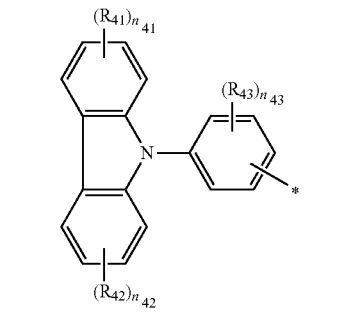
[Chemical Formula 21]
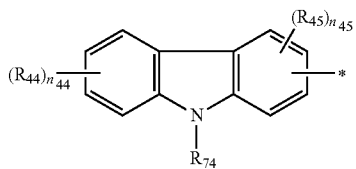
[Chemical Formula 22]
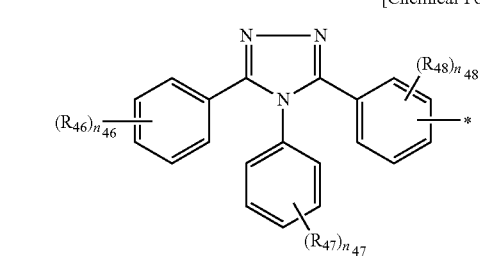
[Chemical Formula 23]
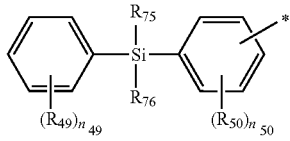
[Chemical Formula 24]
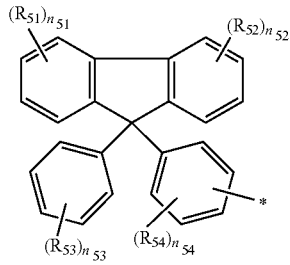
[Chemical Formula 25]
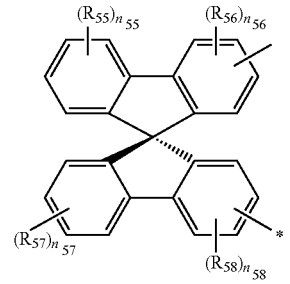
[Chemical Formula 26]
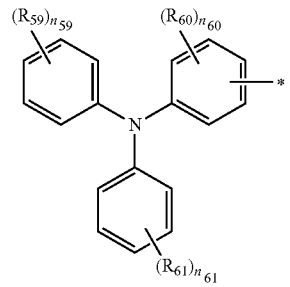
[Chemical Formula 27]
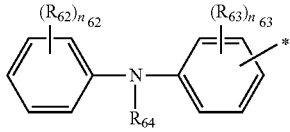
[Chemical Formula 28]
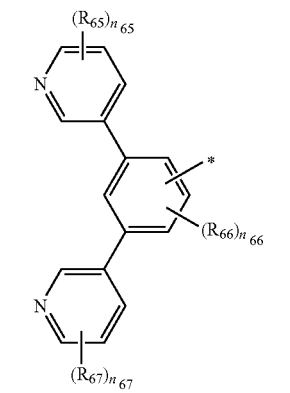

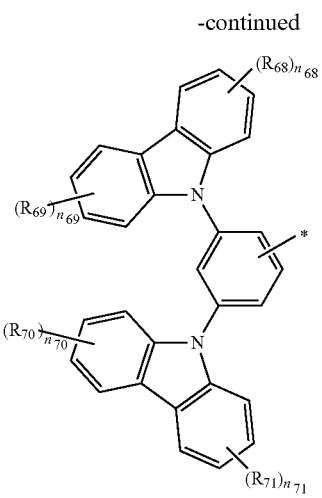

[Chemical Formula 29]

wherein, in the above Formulae 1 to 29, $R_1$ to $R_{13}$ and $R_{16}$ to $R_{76}$ each independently include at least one of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, and $n_1$ to $n_{13}$, $n_{16}$ to $n_{63}$, and $n_{65}$ to $n_{71}$ are each independently integers of 0 to 5.

The pyrrole compound may be a host material or a charge transport material.

The pyrrole compound may have a maximum light emitting wavelength of about 320 to about 500 nm.

The pyrrole compound may have triplet excitation energy (T1) of about 2.0 eV or more.

The embodiments may also be realized by providing an organic photoelectric device including an anode, a cathode, and at least one organic thin layer between the anode and cathode, wherein the at least one organic thin layer includes the pyrrole compound of an embodiment.

The organic thin layer may be an emission layer.

The organic thin layer may include at least one of a hole injection layer (HIL), a hole transport layer (HTL), and a hole blocking layer.

The organic thin layer may include at least one of an electron injection layer (EIL), an electron transport layer (ETL), and an electron blocking layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
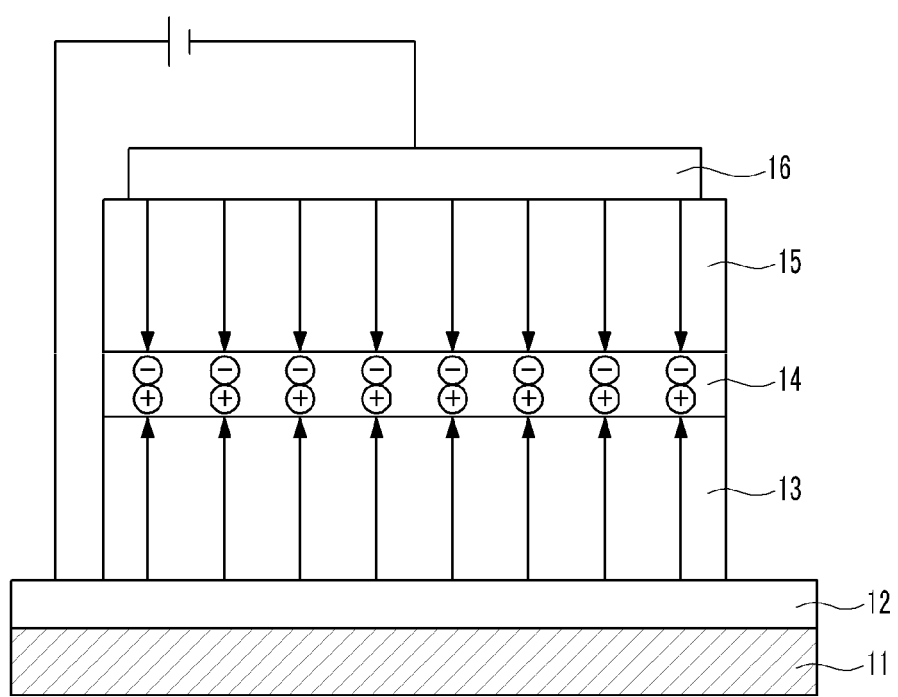
FIG. 1 illustrates a cross-sectional view showing an organic photoelectric device according to an embodiment.

Korean Patent Application No. 10-2008-0086360, filed on Sep. 2, 2008, in the Korean Intellectual Property Office, and entitled: "Pyrrole Compounds and Organic Photoelectric Device Including the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, when specific definition is not provided, the term "substituted" may refer to one substituted with at least a substituent selected from the group consisting of a C1 to C30 alkyl, a halogen, a C1 to C30 alkoxy, a C1 to C30 haloalkyl, a C6 to C30 aryl, and a C2 to C30 heteroaryl.

As used herein, when specific definition is not provided, the term "hetero" may refer to one including 1 to 3 heteroatoms selected from the group consisting of nitrogen (N), oxygen (O), sulfur (S), and phosphorus (P), and the remainder being carbon.

An organic photoelectric device may include an organic light emitting material between a rear plate including ITO transparent electrode patterns as an anode on a transparent glass substrate and an upper plate including a metal electrode as a cathode on a substrate. When a predetermined voltage is applied between the transparent electrode and the metal electrode, the organic light emitting material may emit light due to a current flowing through them. Such an organic light emitting material for an organic photoelectric device may include a low molecular aromatic diamine and an aluminum complex as an emission-layer-forming material.

The organic light emitting material or layer may have a structure in which a thin film (a hole transport layer (HTL)) of a diamine derivative and a thin film of tris(8-hydroxy-quinolate)aluminum ($Alq_3$) are laminated. The $Alq_3$ thin film functions as an emission layer for transporting electrons.

Generally, the organic photoelectric device may include an anode including a transparent electrode, an organic thin layer having a light emitting region, and a metal electrode (a cathode) on a glass substrate (in that order). The organic thin layer may include, e.g., an emission layer, a hole injection layer (HIL), a hole transport layer (HTL), an electron transport layer (ETL), and/or an electron injection layer (EIL). The organic thin layer may further include an electron blocking layer or a hole blocking layer due to the emission characteristics of the emission layer.

When power is supplied to the organic photoelectric device, holes and electrons may be injected from the anode and the cathode, respectively. The injected holes and electrons may be recombined with one another on the emission layer though the hole transport layer (HTL) and the electron transport layer (ETL) to provide light emitting excitons. The light emitting excitons may transit to the ground state and emit light.

The light emission material may be classified as a fluorescent material (including singlet excitons) and a phosphorescent material (including triplet excitons). Phosphorescent light-emitting material may be used for a light emitting material in addition to the fluorescent light emitting material. Such phosphorescent emission may occur by transiting electrons from the ground state to the exited state, after non-radiative transiting of a singlet exciton to a triplet exciton through intersystem crossing and transiting the triplet exciton to the ground state to emit light.

When the triplet exciton is transited, it may not directly transit to the ground state. Therefore, it may be transited to the ground state after the electron spin is flipped, and may thereby provide a characteristic of extending the lifetime (emission duration) to more than that of fluorescent emission.

In other words, the duration of fluorescent emission may be extremely short, e.g., several nanoseconds. The duration of phosphorescent emission may be relatively long, e.g., several microseconds, so that it may provide a characteristic of extending the lifetime (emission duration) to more than that of the fluorescent emission.

In addition, evaluating quantum-mechanically, when holes injected from the anode are recombined with electrons injected from the cathode to provide light emitting excitons, the singlet and the triplet are produced in a ratio of 1:3, in which three times the triplet light emitting excitons are produced compared to the amount of the singlet light emitting excitons in the organic photoelectric device.

A fluorescent material has 25% of the singlet-exited state (the triplet is 75%) and a limit in luminous efficiency. On the other hand, a phosphorescent material can utilize 75% of the triplet exited state and 25% of the singlet exited state, so it can theoretically reach 100% of the internal quantum efficiency. Accordingly, the phosphorescent light emitting material may have advantages of accomplishing around four times more luminous efficiency than the fluorescent light emitting material.

In the above-mentioned organic light emitting diode, a light emitting colorant (dopant) may be added in an emission layer (host) in order to increase the efficiency and stability in the emission state.

An embodiment provides a pyrrole compound represented by the following General Formula 1.

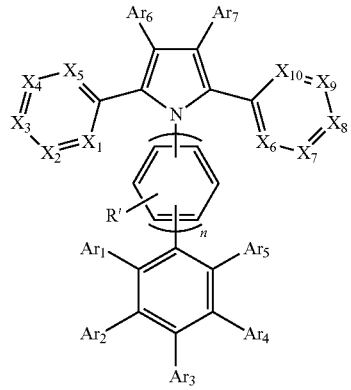

[General Formula 1]

In the General Formula 1:

R' may include at least one of hydrogen and a C1 to C6 alkyl, $Ar_1$ to $Ar_5$ may each independently include at least one of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl. In an implementation, $Ar_1$ to $Ar_5$ are neither a pyridyl group nor a pyrrole derivative group.

In General Formula 1, $Ar_6$ and $Ar_7$ may each independently include at least one of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; substituted or unsubstituted C1 to C20 phosphoric acid amide; and a substituted or unsubstituted C3 to C40 silyl, $X_1$ to $X_{10}$ may each independently include at least one of CR" and N, where R" includes at least one of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, and n is an integer of 1 or 2.

As noted above, in the General Formula 1, n may be an integer of 1 or 2. Having n greater than 0 may help ensure the ability to control the UV absorption wavelength and PL light emitting wavelength. According to an embodiment, when a pyrrole compound is used as a phosphorescent host and is 1 or 2, blue to red light-emitting colors may be realized.

In an embodiment, $Ar_1$ to $Ar_5$ are not a pyrrole derivative group represented by the following General Formula 2. If $Ar_1$ to $Ar_5$ is a group represented by the following General Formula 2, it may be difficult to use the compound of the General Formula 1 as a phosphorescent host, since it may be difficult to adjust triplet excited energy ($T_1$).

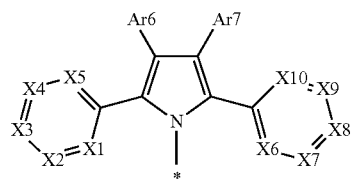

[General Formula 2]

In the General Formula 2,

X1 to X10 are the same or different and are independently selected from the group consisting of CR" and N, where R" is selected from the group consisting of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, and $Ar_6$ and $Ar_7$ are the same or different, and are independently selected from the group consisting of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl.

In an implementation, in General Formula 1, $Ar_1$ to $Ar_5$ may each independently include at least one of a substituted or unsubstituted carbazolyl; a substituted or unsubstituted arylamino; a substituted or unsubstituted phenyl; a substituted or unsubstituted tolyl; a substituted or unsubstituted naphthyl; a substituted or unsubstituted stilbenzyl; a substituted or unsubstituted fluorenyl; a substituted or unsubstituted anthracenyl; a substituted or unsubstituted terphenyl; a substituted or unsubstituted pyrenyl; a substituted or unsubstituted diphenylanthracenyl; a substituted or unsubstituted dinaphthylanthracenyl; a substituted or unsubstituted pentacenyl; a substituted or unsubstituted bromophenyl; a substituted or unsubstituted hydroxyphenyl; a substituted or unsubstituted thienyl; a substituted or unsubstituted azobenzenyl; and a substituted or unsubstituted ferrocenyl.

In an implementation, in General Formulae 1 and 2, $Ar_6$ and $Ar_7$ may each independently include at least one of a substituted or unsubstituted carbazolyl; a substituted or unsubstituted arylamino; a substituted or unsubstituted phenyl; a substituted or unsubstituted tolyl; a substituted or unsubstituted naphthyl; a substituted or unsubstituted stilbenzyl; a substituted or unsubstituted fluorenyl; a substituted or unsubstituted anthracenyl; a substituted or unsubstituted terphenyl; a substituted or unsubstituted pyrenyl; a substituted or unsubstituted diphenylanthracenyl; a substituted or unsubstituted dinaphthylanthracenyl; a substituted or unsubstituted pentacenyl; a substituted or unsubstituted bromophenyl; a substituted or unsubstituted hydroxyphenyl; a substituted or unsubstituted thienyl; a substituted or unsubstituted pyridyl; a substituted or unsubstituted azobenzenyl; and a substituted or unsubstituted ferrocenyl.

In another implementation, in General Formula 1 and 2, $Ar_1$ to $Ar_7$ may each independently include at least one moiety represented by the following Chemical Formulae 1 to 29, the star representing attachment.

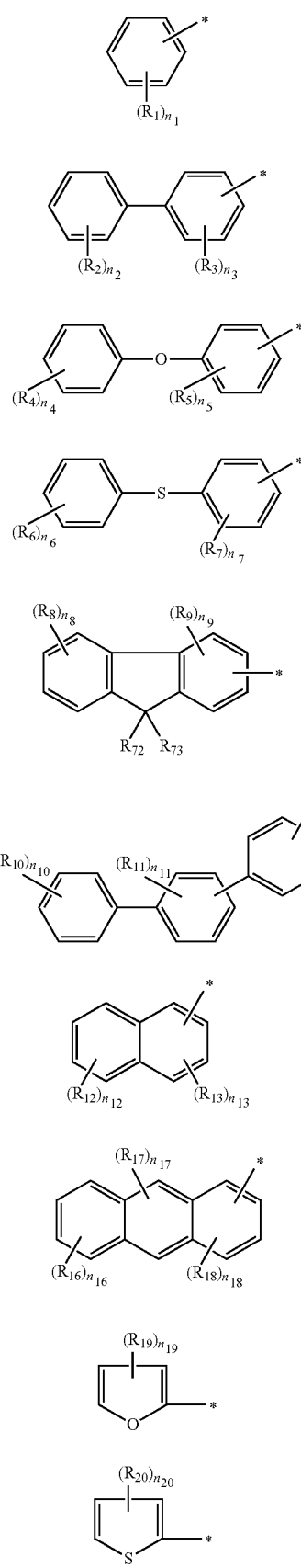
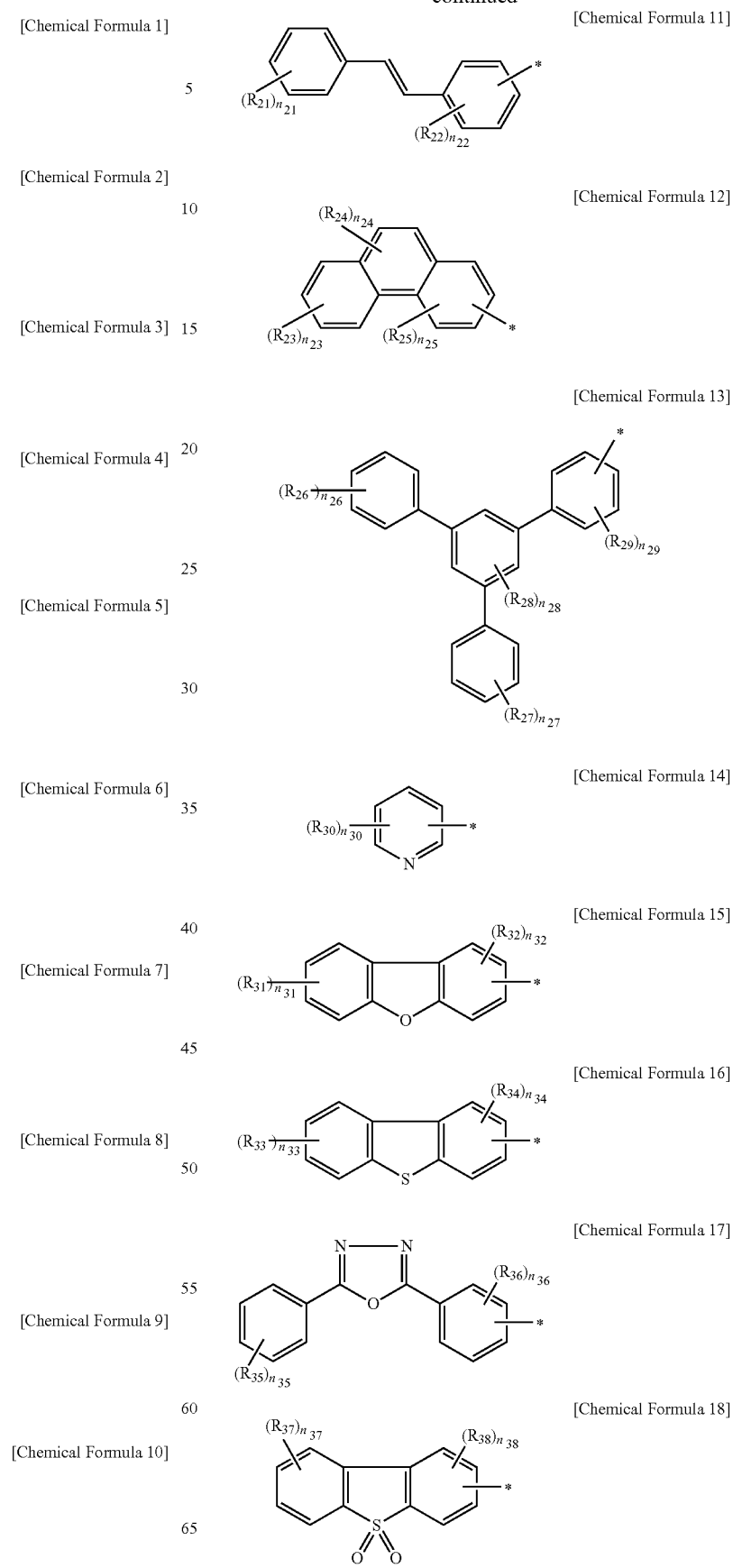

[Chemical Formula 19]
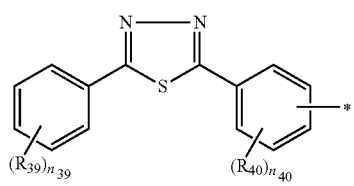
[Chemical Formula 20]
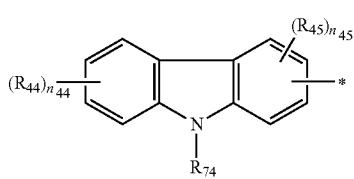
[Chemical Formula 21]
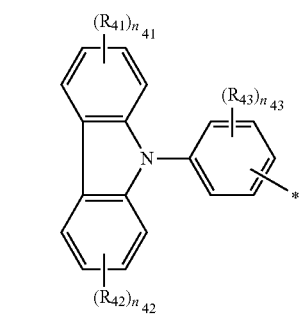
[Chemical Formula 22]
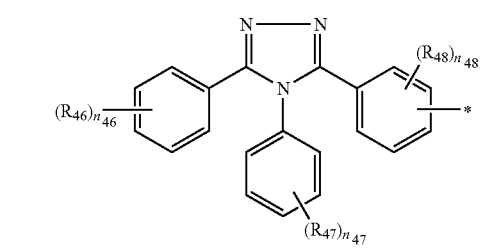
[Chemical Formula 23]
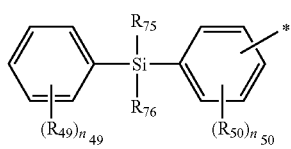
[Chemical Formula 24]
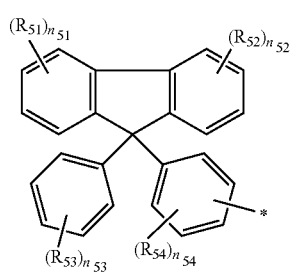
[Chemical Formula 25]
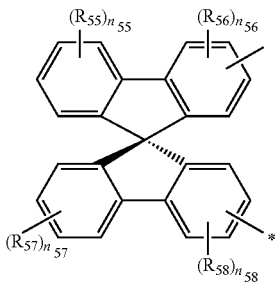
[Chemical Formula 26]
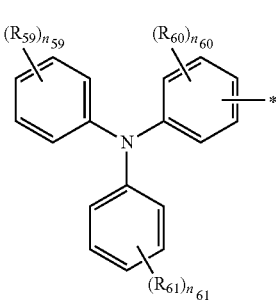
[Chemical Formula 27]
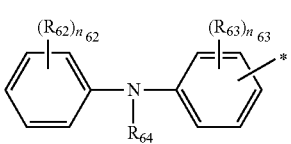
[Chemical Formula 28]
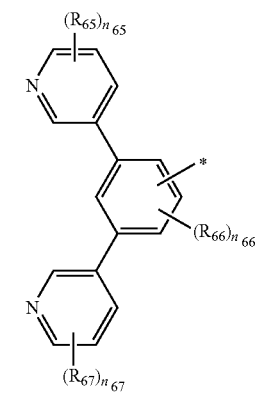
[Chemical Formula 29]
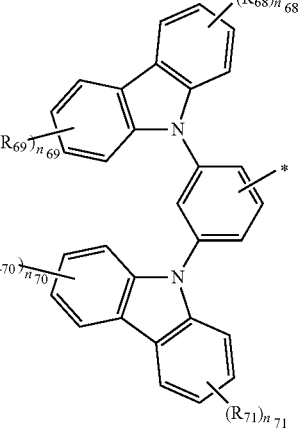

In the above Formulae 1 to 29,

R$_1$ to R$_{13}$ and R$_{16}$ to R$_{76}$ may each independently be at least one of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, and n$_1$ to n$_{13}$, n$_{16}$ to n$_{63}$, and n$_{65}$ to n$_{71}$ are each independently integers of 0 to 5.

The pyrrole compound represented by General Formula 1 may include a compound represented by Chemical Formulae 30 to 91, below.

[Chemical Formula 30]

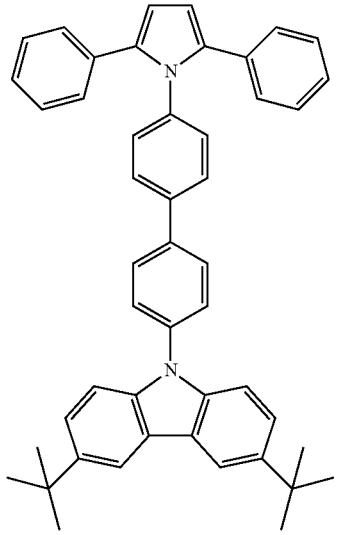

[Chemical Formula 31]

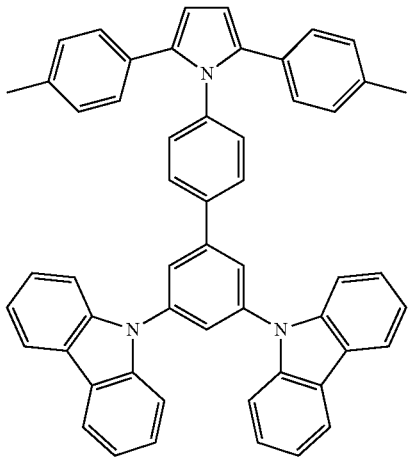

[Chemical Formula 32]

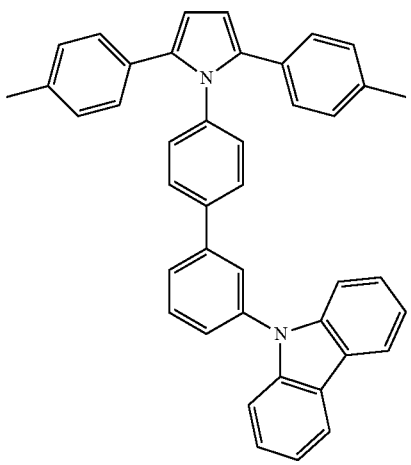

[Chemical Formula 33]

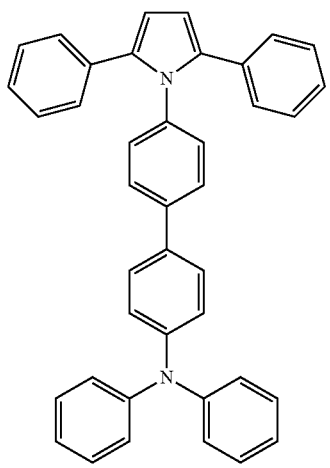

-continued
[Chemical Formula 34]
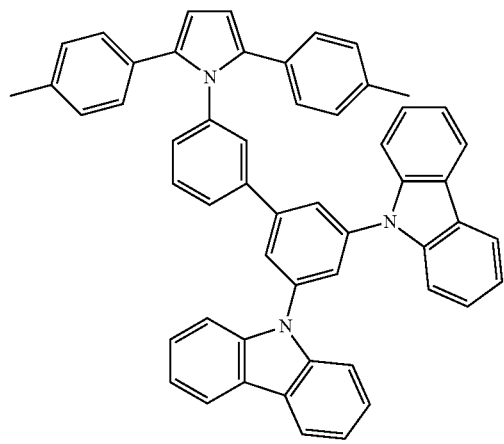
[Chemical Formula 35]
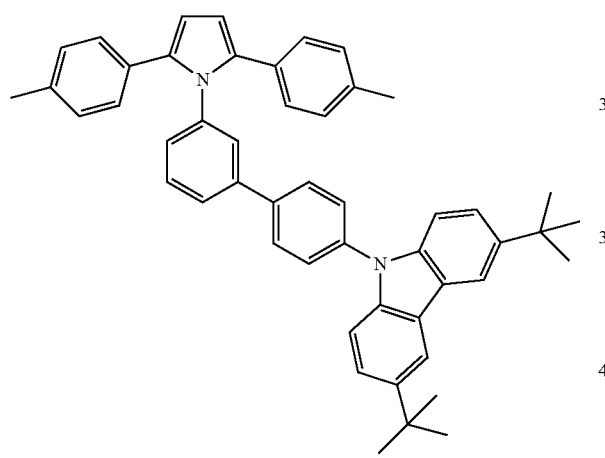
[Chemical Formula 36]
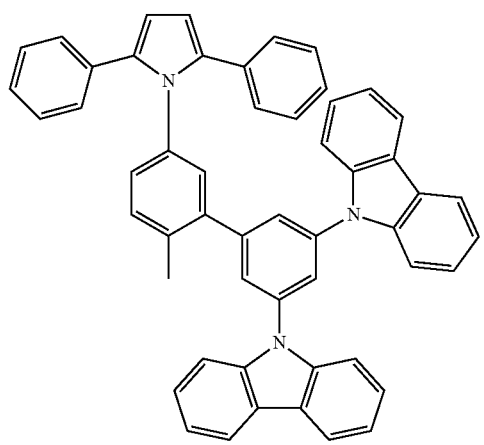
-continued
[Chemical Formula 37]
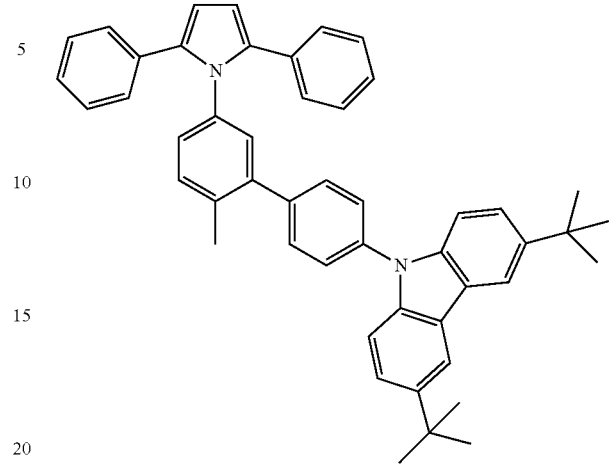
[Chemical Formula 38]
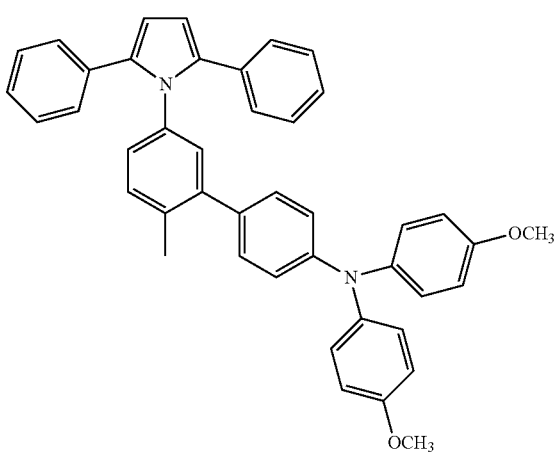
[Chemical Formula 39]
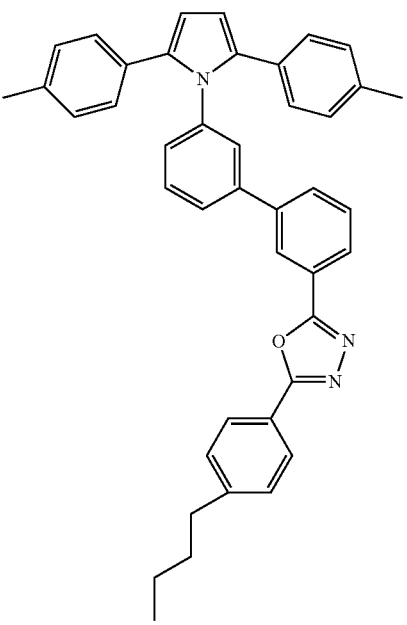

[Chemical Formula 40]
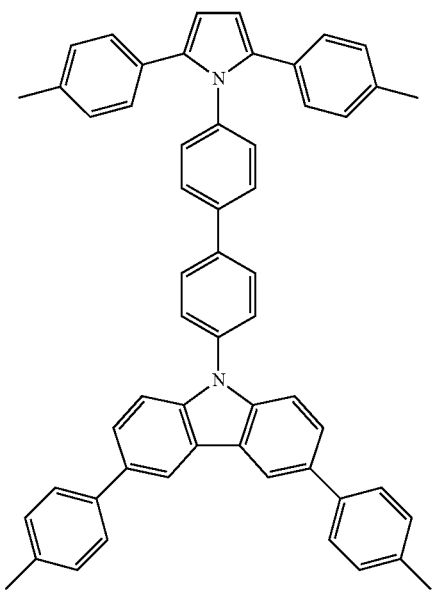
[Chemical Formula 41]
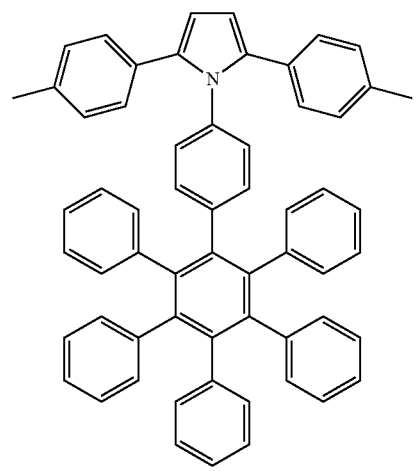
[Chemical Formula 42]
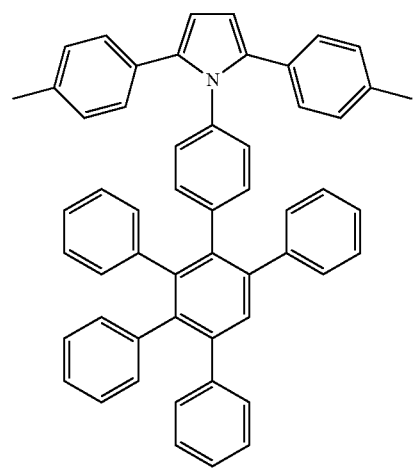
[Chemical Formula 43]
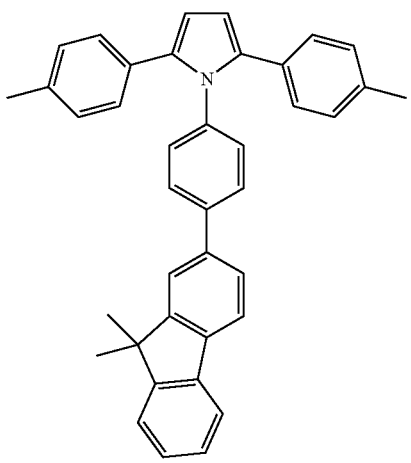
[Chemical Formula 44]
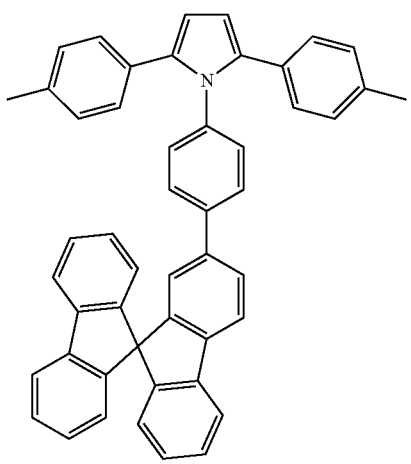
[Chemical Formula 45]
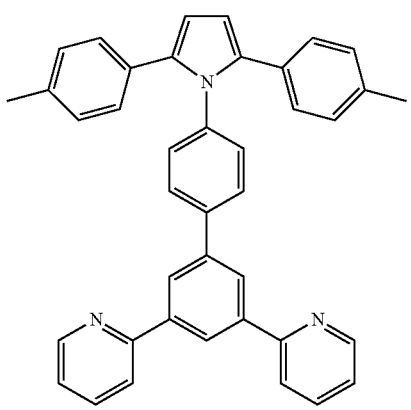

[Chemical Formula 46]
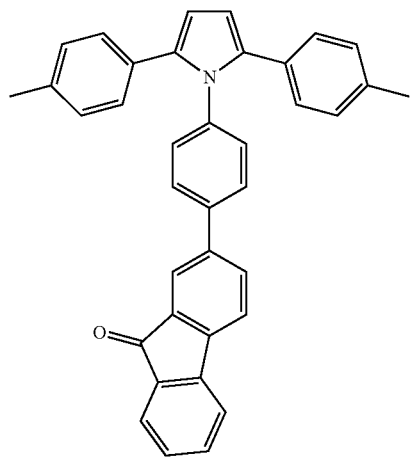
[Chemical Formula 47]
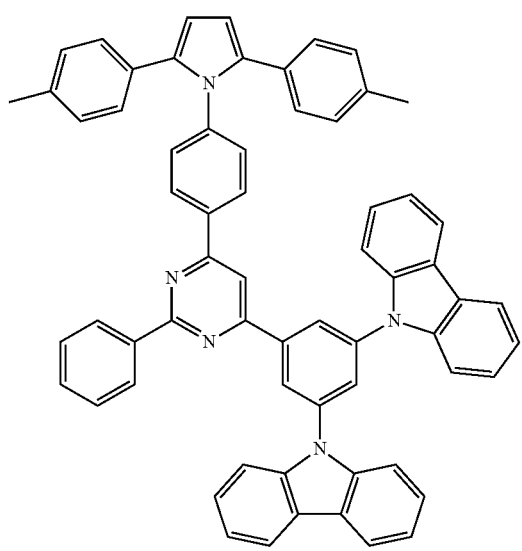
[Chemical Formula 48]
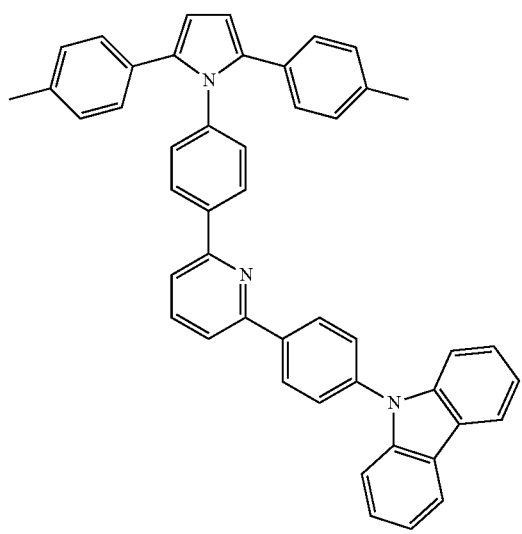
[Chemical Formula 49]
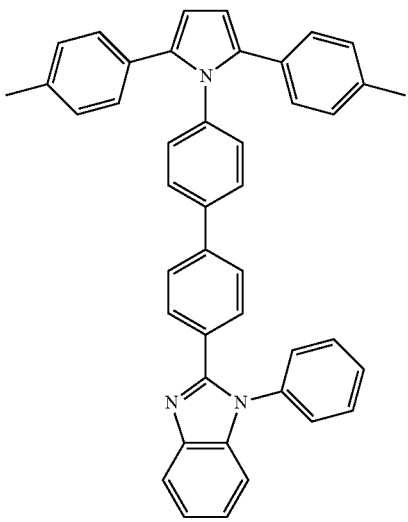
[Chemical Formula 50]
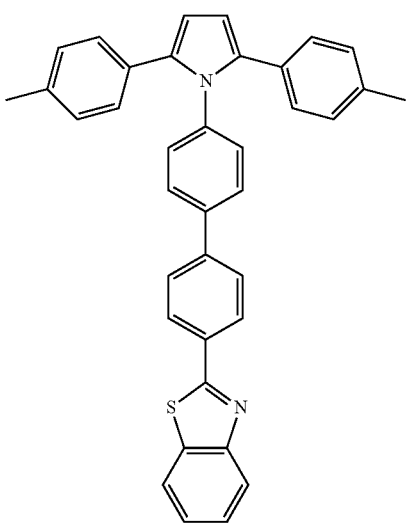
[Chemical Formula 51]
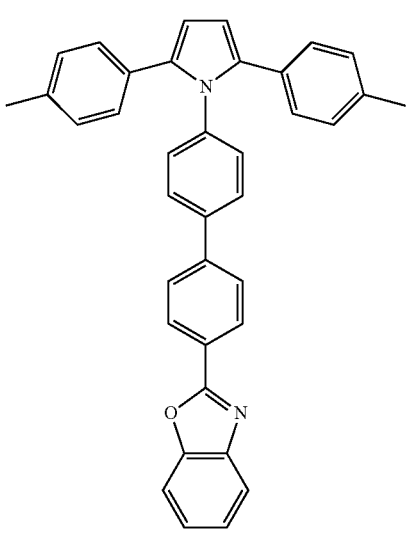

[Chemical Formula 52]
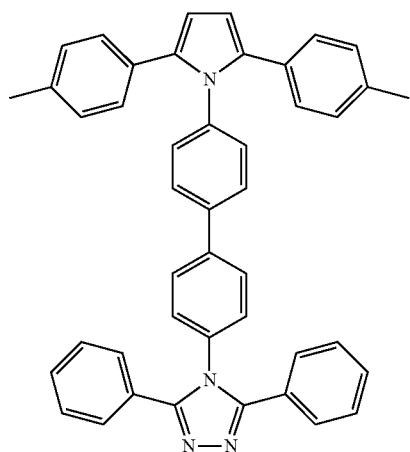
[Chemical Formula 53]
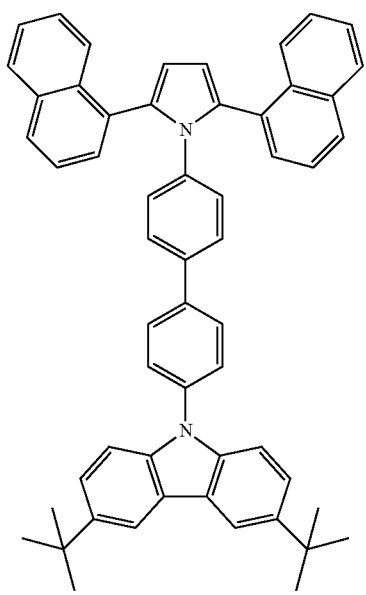
[Chemical Formula 54]
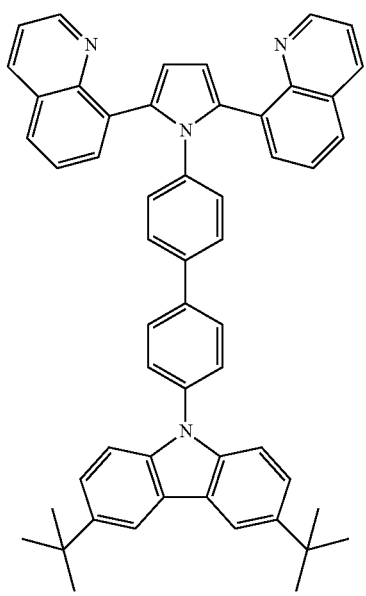
[Chemical Formula 55]
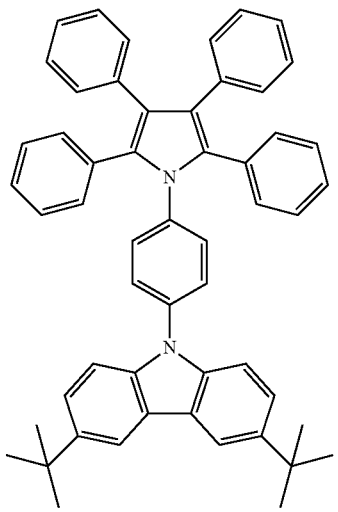
[Chemical Formula 56]
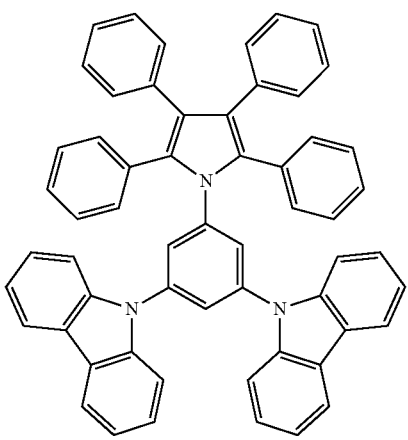
[Chemical Formula 57]
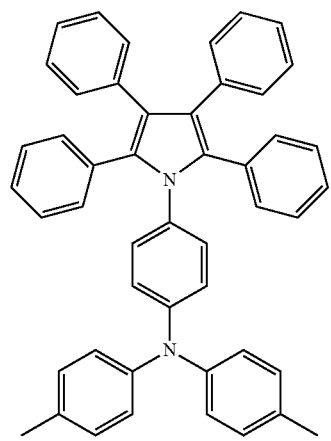

[Chemical Formula 58]
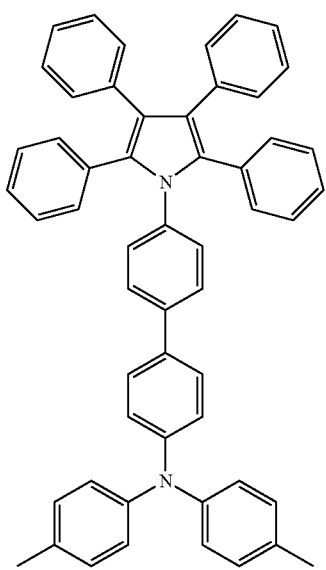
[Chemical Formula 59]
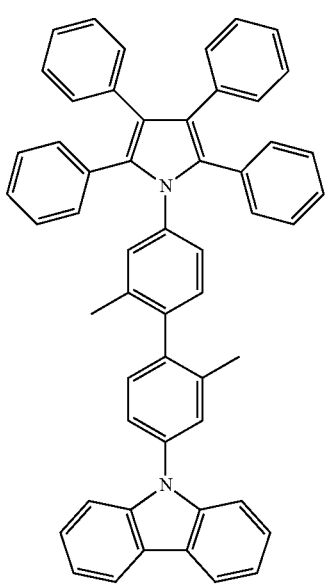
[Chemical Formula 60]
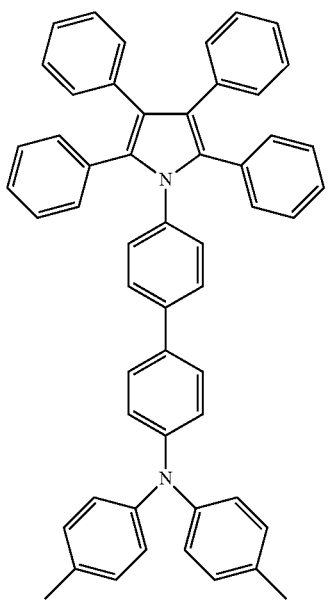
[Chemical Formula 61]
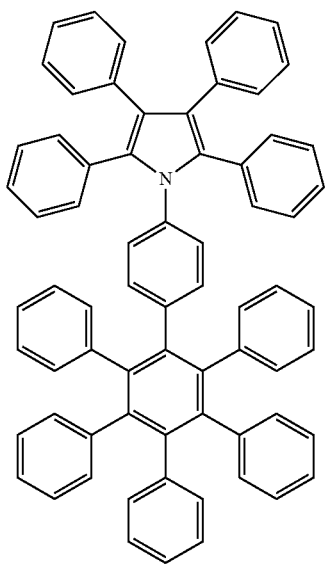

[Chemical Formula 62]
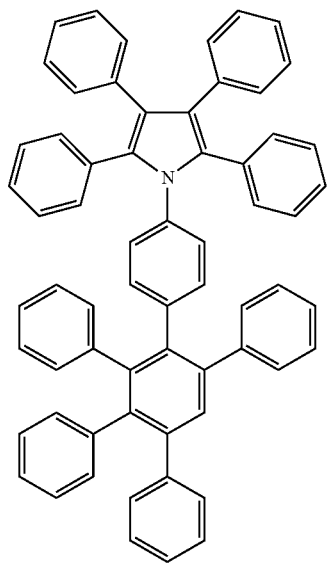
[Chemical Formula 63]
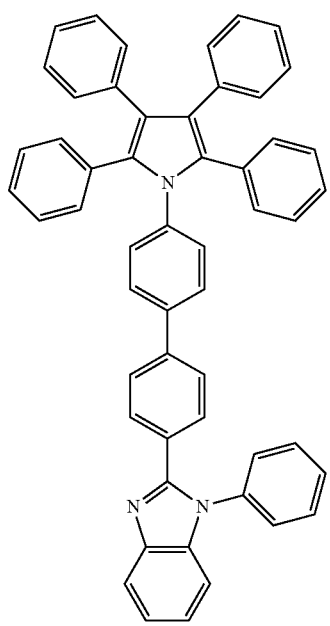
[Chemical Formula 64]
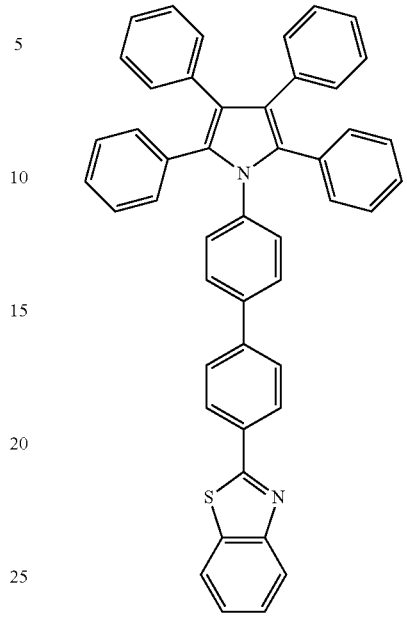
[Chemical Formula 65]
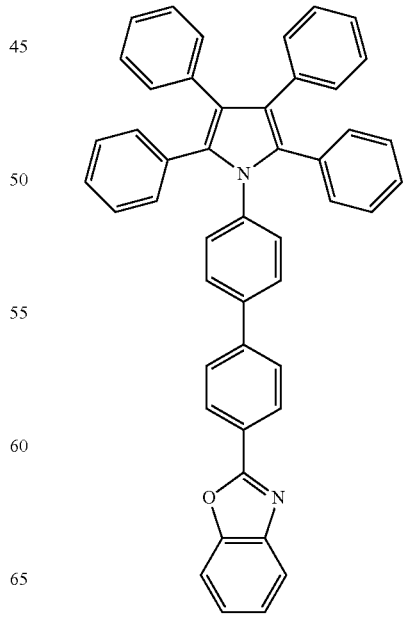

[Chemical Formula 66]
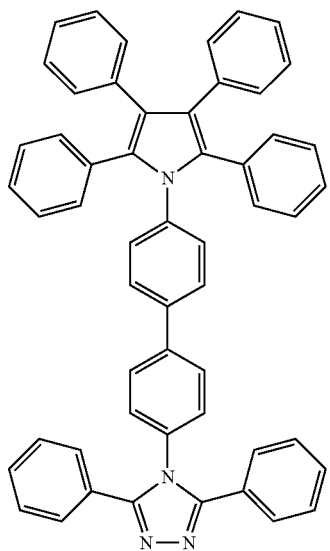
[Chemical Formula 67]
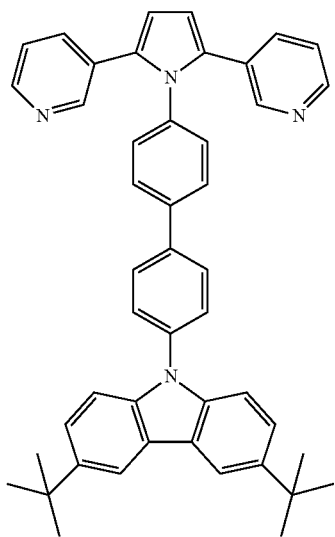
[Chemical Formula 68]
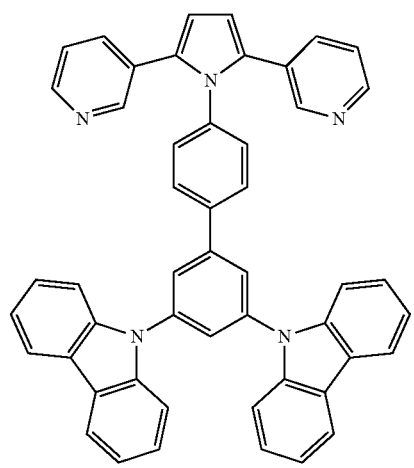
[Chemical Formula 69]
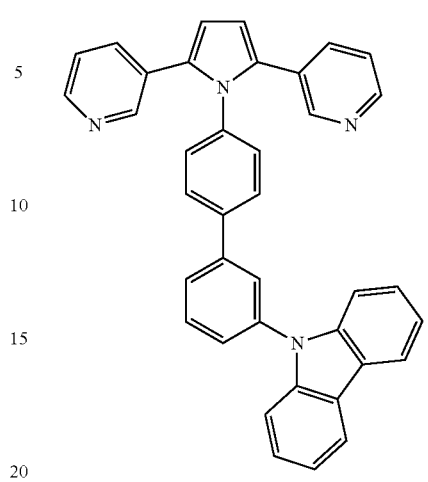
[Chemical Formula 70]
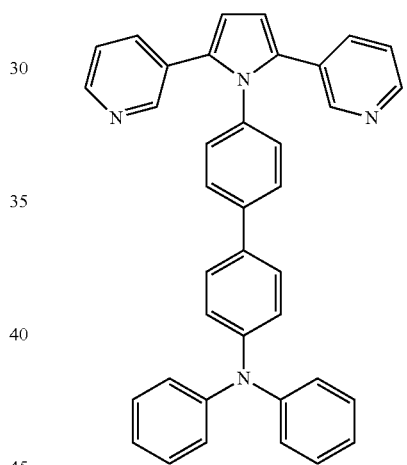
[Chemical Formula 71]
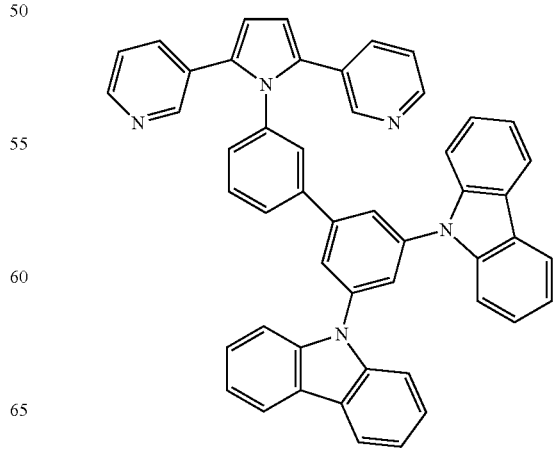

[Chemical Formula 72]
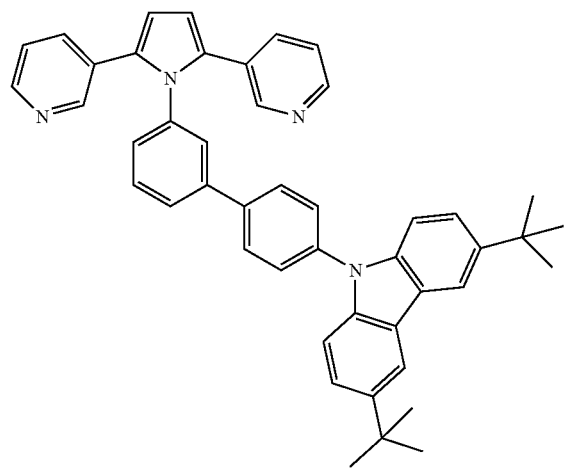
[Chemical Formula 73]
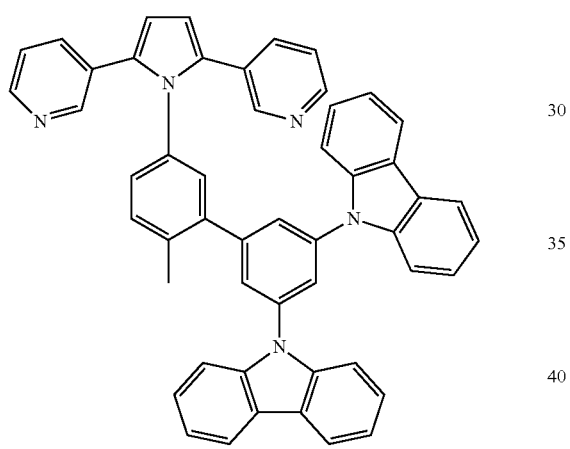
[Chemical Formula 74]
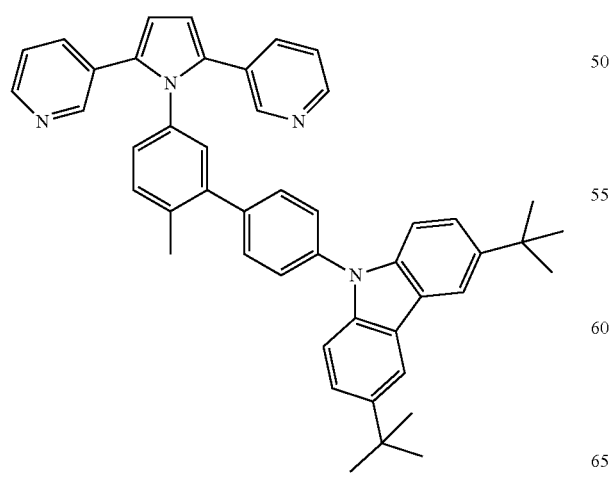
[Chemical Formula 75]
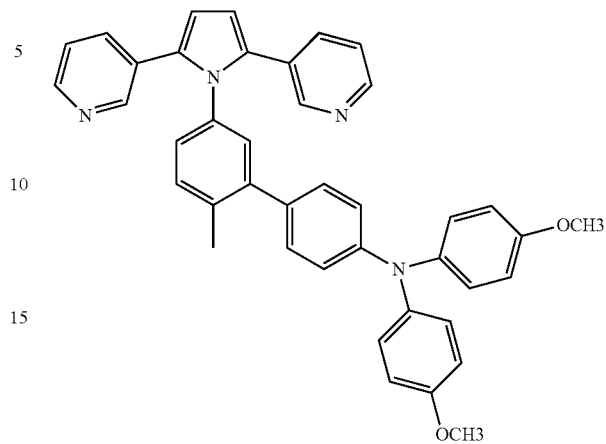
[Chemical Formula 76]
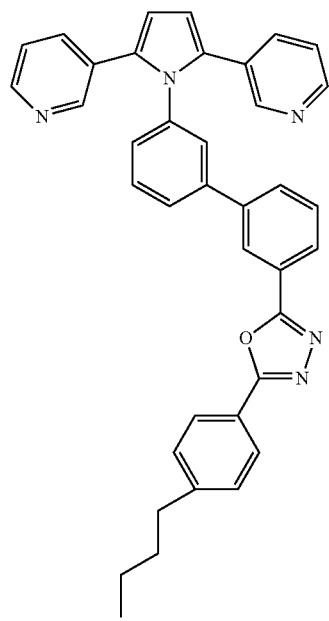

[Chemical Formula 77]
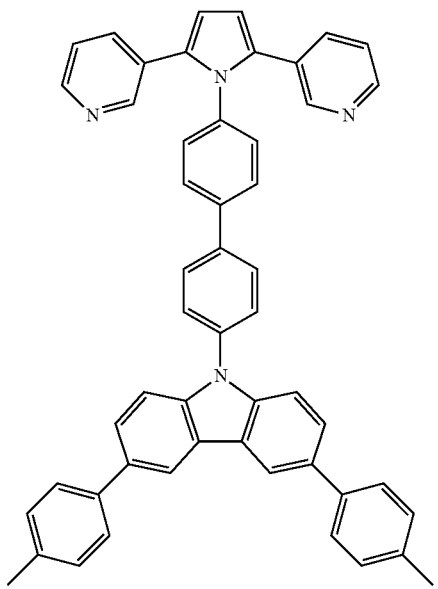
[Chemical Formula 78]
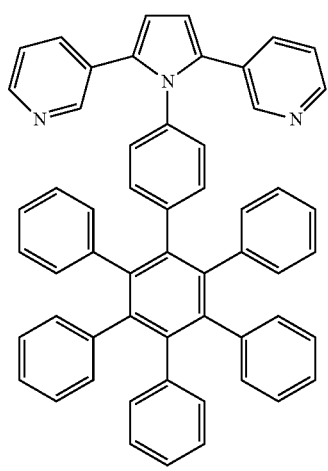
[Chemical Formula 79]
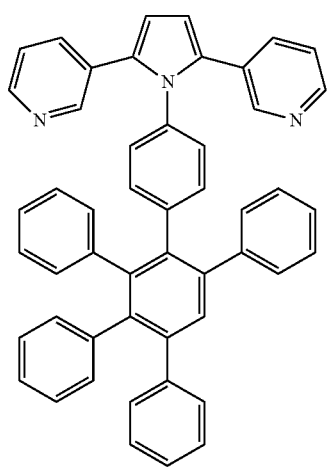
[Chemical Formula 80]
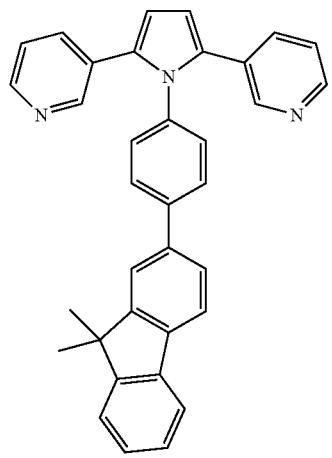
[Chemical Formula 81]
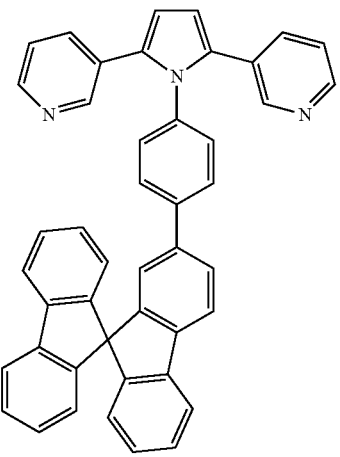
[Chemical Formula 82]
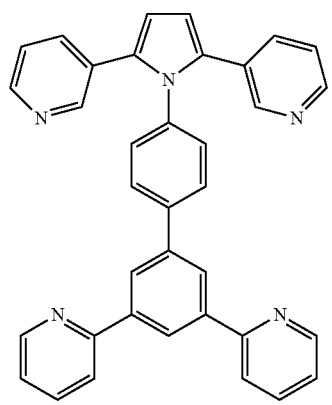

-continued
[Chemical Formula 83]
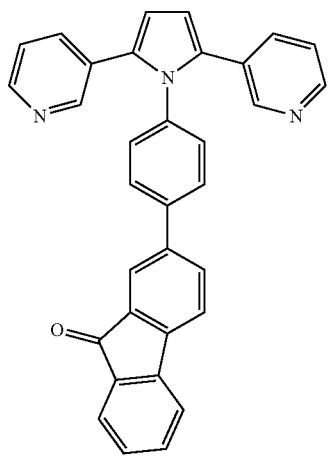
[Chemical Formula 84]
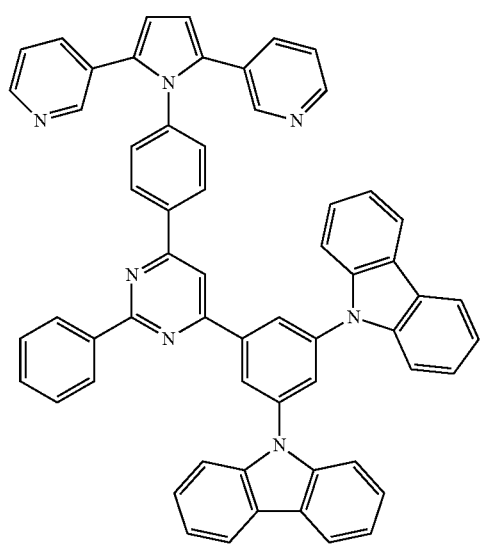
[Chemical Formula 85]
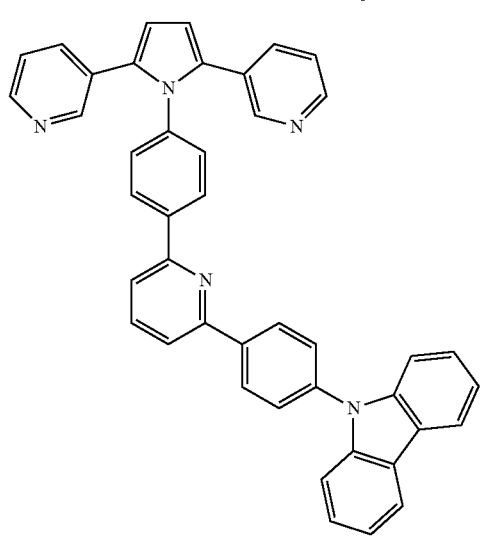
-continued
[Chemical Formula 86]
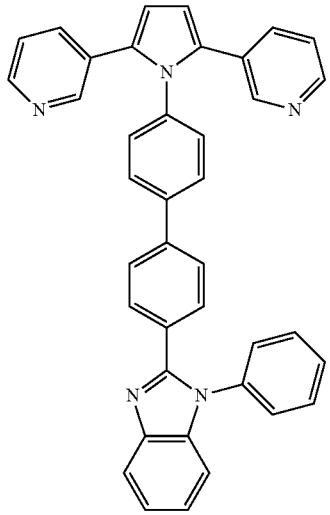
[Chemical Formula 87]
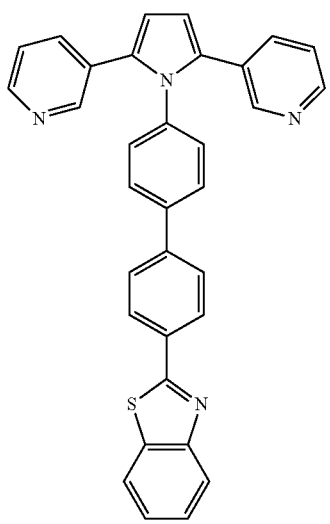
[Chemical Formula 88]
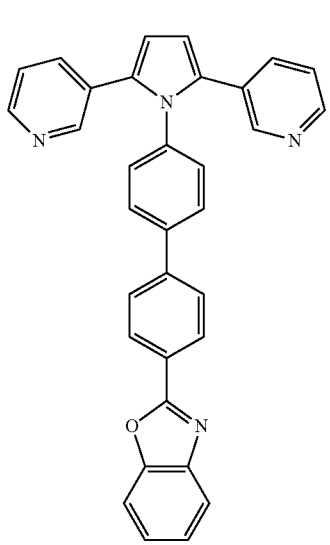

[Chemical Formula 89]

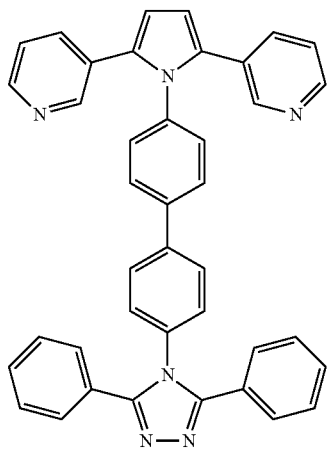

[Chemical Formula 90]

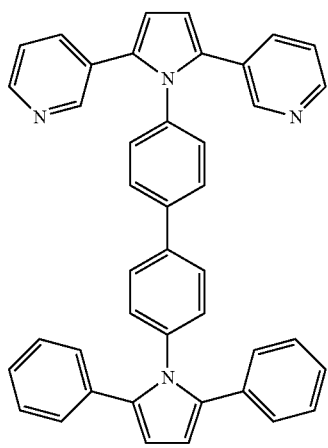

[Chemical Formula 91]

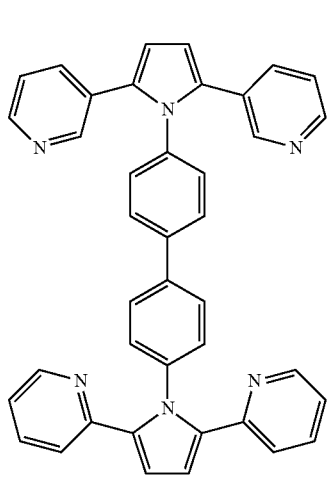

When the pyrrole compound is applied to an electron blocking layer and/or a hole transport layer (HTL), hole blocking properties thereof may be reduced due to a hole transport backbone. Accordingly, when the compound is applied to an electron blocking layer, it is preferable that the compound does not include an electron transport backbone. For example, an electron transport backbone may include benzimidazole, pyridine, pyrazine, pyrimidine, triazine, quinoline, isoquinoline, and the like. However, when it is desirable for the compound to exhibit electron-transporting and hole-transporting properties, a light emitting diode may have improved life-span and reduced driving voltage by introducing the electron transport backbone.

According to the present embodiment, a pyrrole compound may have a maximum light emitting wavelength ranging from about 320 to about 500 nm and triplet excitation energy of about 2.0 eV or more (T1). In an implementation, the triplet excitation energy may be about 2.0 to about 4.0 eV. When the pyrrole compound has this high excitation energy, it may transport a charge to a dopant well, may improve luminous efficiency of the dopant, and may also decrease a driving voltage by freely regulating HOMO and LUMO energy levels. Accordingly, the pyrrole compound may be usefully applied as a host material or a charge-transporting material.

The pyrrole compound may be also used as, e.g., a nonlinear optical material, an electrode material, a chromic material, and/or as a material applicable to an optical switch, a sensor, a module, a waveguide, an organic transistor, a laser, an optical absorber, a dielectric material, and/or a membrane due to its optical and electrical properties. In an implementation, the pyrrole compound according to an embodiment may be applicable to a photoelectric device.

Another embodiment provides an organic photoelectric device including an anode, a cathode, and an organic thin layer disposed between the anode and cathode. The organic thin layer may include the pyrrole compound according to an embodiment. The organic photoelectric device may include an organic light emitting diode, an organic solar cell, an organic transistor, an organic photo-conductor drum, an organic memory device, and the like. For example, the organic photoelectric device is preferably an organic light emitting diode.

The pyrrole compound may be applied to an emission layer for an organic thin layer. The organic thin layer may include, e.g., a hole injection layer (HIL), a hole transport layer (HTL), a hole blocking layer, and combinations thereof, or may be selected from the group consisting of an electron injection layer (EIL), an electron transport layer (ETL), an electron blocking layer, and combinations thereof.

An organic photoelectric device including an anode, a cathode, and an organic thin layer between the anode and the cathode may include a general device structure including an anode, an emission layer, and a cathode. The organic thin layer of the organic photoelectric device may further include an inter-layer, a hole transport layer (HTL), and an electron transport layer (ETL). The inter-layer refers to a buffer layer such as a hole injection layer (HIL), a hole blocking layer, an electron injection layer (EIL), or an electron blocking layer.

FIG. 1 illustrates a cross-sectional schematic view of an organic photoelectric device according to an embodiment. FIG. 1 illustrates an organic photoelectric device including a substrate 11, an anode 12, a hole transport layer (HTL) 13, an emission layer 14; an electron transport layer (ETL) 15, and a cathode 16.

Referring to FIG. 1, a method of fabricating an organic photoelectric device using the compound may be illustrated as follows.

First, an anode 12 material may be coated on an upper side of a substrate 11.

The substrate 11 may be, e.g., a glass substrate or a transparent plastic substrate having excellent general transparence, face smoothness, handling ease, and water repellency.

The anode 12 material may include, e.g., transparent and highly conductive indium tin oxide (ITO), tin oxide (SnO$_2$), zinc oxide (ZnO), or so on.

Then, a hole transport layer (HTL) 13 may be disposed on the anode 12 by, e.g., vacuum deposition, sputtering, or spin coating. An emission layer 14 may be disposed on the hole transport layer (HTL) 13 using, e.g., a vacuum deposition method or a solution coating method such as spin coating, Inkjet printing, and so on.

An electron transport layer (ETL) 15 may be disposed between the emission layer 14 and a cathode 16.

The emission layer 14, the hole transport layer (HTL) 13, and the electron transport layer (ETL) 15 may have a predetermined thickness, but are not specifically limited. The emission layer 14 may have a thickness of about 5 nm to about 1 μm, and preferably about 10 to about 500 nm. The hole transport layer (HTL) 13 and the electron transport layer (ETL) 15 may respectively have a thickness of about 10 to about 10,000 Å.

The electron transport layer (ETL) 15 may be formed using, e.g., vacuum deposition, sputtering, or spin coating by using a material for an electron transport layer (ETL) 15.

The hole transport layer (HTL) 13 and the electron transport layer (ETL) 15 may efficiently transport a carrier to the emission layer 14 to heighten light-emitting combination possibility in the emission layer 14.

The hole transport layer (HTL) 13 material may include, but is not limited to, poly(3,4-ethylenedioxy-thiophene) (PEDOT) doped with poly(styrenesulfonic acid) (PSS), and N,N'-bis(3-methylphenyl)-N,N-diphenyl-[1,1'-biphenyl]-4,4'-diamine (TPD).

The electron transport layer (ETL) 15 material may include, but is not limited to, aluminum trihydroxyquinoline (Alq$_3$), a 1,3,4-oxadiazole derivative such as 2-(4-biphenylyl-5-phenyl-1,3,4-oxadiazole (PBD), a quinoxaline derivative such as 1,3,4-tris[(3-phenyl-6-trifluoromethyl)quinoxalin-2-yl]benzene (TPQ), and a triazole derivative.

The pyrrole compound of an embodiment may be mixed with a phosphorescent light emitting organic compound. The phosphorescent organic compound may be a phosphorescent light emitting organic metal complex that emits from its triplet state, and is preferably a metal complex of at least one group VIII metal ion according to the periodic table of Gregor Johann Mendel. The group VIII metal ion may include a metal ion, e.g., Fe, Co, Ni, Ru, Rh, Pd, Os, Ir, and pt, and is preferably Ir or Pt.

Examples of the metal complex may include compounds represented by the following Chemical Formulae 92 to 94, but are not limited thereto.

[Chemical Formula 92]

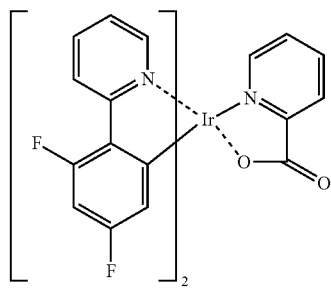

[Chemical Formula 93]

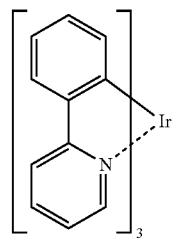

[Chemical Formula 94]

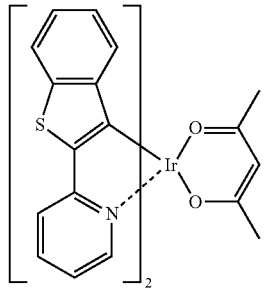

When the organic thin layer including the organic compound is formed using a solution coating, another low molecular weight host material can be included along with the organic compound. Examples of the low molecular weight host material may include compounds represented by the following Formulae 95 to 98, but are not limited thereto.

[Chemical Formula 95]

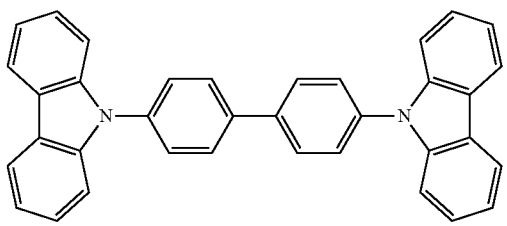

[Chemical Formula 96]

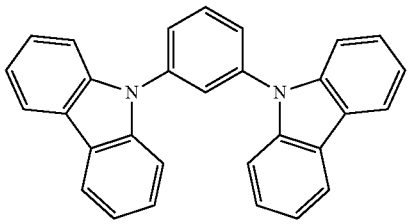

[Chemical Formula 97]

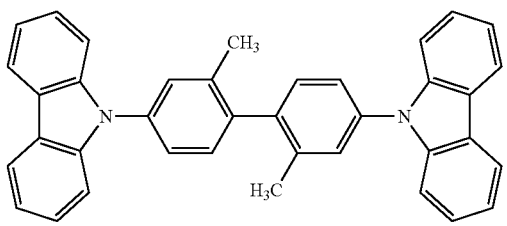

-continued

[Chemical Formula 98]

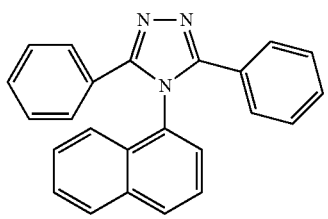

The pyrrole compound of an embodiment may be used by mixing it with polymers having conjugated double bonds, e.g., fluorene-based polymers, polyphenylenevinylene-based polymers, and polyparaphenylene-based polymers, and also by mixing it with binder resins.

The binder resins may include, e.g., polyvinylcarbazole (PVK), polycarbonate, polyester, polyan arylate, polystyrene, acryl polymers, methacryl polymers, polybutyral, polyvinylacetal, diallylphthalate polymers, phenol resins, epoxy resins, silicone resins, polysulfone resins, or urea resins. These resins may be used singularly or in combinations.

Selectively, a hole blocking layer may be disposed using vacuum deposition to limit a speed of transporting holes into the emission layer 14 and thus to increase possibility of recombining electrons and holes.

A cathode 16 material may be coated on the electron transport layer (ETL).

The cathode material may include, e.g., lithium (Li), magnesium (Mg), calcium (Ca), aluminum (Al), Al:Li, Ba:Li, or Ca:Li having a small work function.

EXAMPLES

The following examples illustrate the present invention in more detail. However, it is understood that the present invention is not limited by these examples.

A person having ordinary skill in this art can sufficiently understand parts of the present invention that are not specifically described.

In the following Examples 1 to 6, compounds M-1 to M-6 (for preparing a pyrrole compound of an embodiment) were respectively prepared as shown in Reaction Schemes 1 to 6.

Synthesis Example 1

Synthesis of M-1

[Reaction Scheme 1]

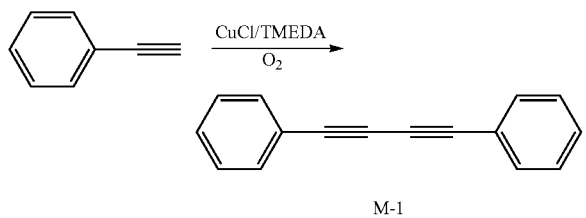

23 g (0.22 mol) of ethynylbenzene, 1.2 g (12.1 mmol) of copper (I) chloride, and 1.4 g (12 mmol) or N,N,N',N'-tetramethylethylenediamine (TMEDA) were put in 200 ml of an acetone solvent in a 500 ml round-bottomed flask having a mechanical agitator. The mixture was strongly agitated for one hour at room temperature while being bubbled with oxygen. When the reaction was complete, the mixture was dried under reduced pressure to remove the solvent. The resulting product was precipitated in a 5% hydrochloric acid aqueous solution, preparing a white solid. The solid was recrystallized in ethanol and dried, preparing 18.4 g (yield: 81%) of transparent crystal M-1. It had a melting point at a temperature of 87 to 88° C.

Synthesis Example 2

Synthesis of M-2

[Reaction Scheme 2]

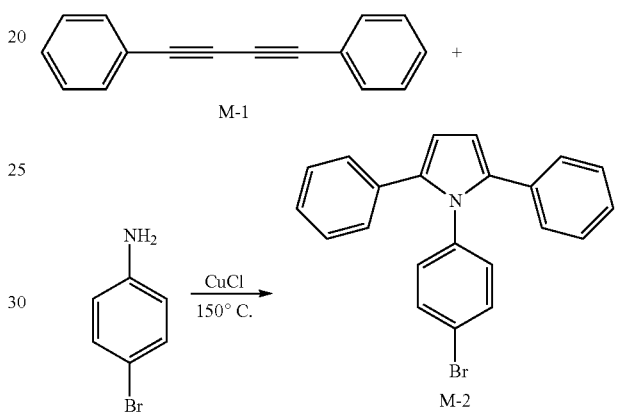

5 g (24.7 mmol) of 1,4-di-phenylbutadiene (M-1), 4.67 g (27.1 mmol) of p-bromoaniline, and 0.58 g (5.9 mmol) of copper (I) chloride were put in a 250 ml round-bottomed flask under an argon atmosphere. The mixture was agitated for reaction at 150° C. for 5 hours. After the reaction, the reactant was cooled down and dissolved in methylene chloride. The solution was washed several times with 5% hydrochloric acid. The prepared organic solution was washed several times with water and dried with anhydrous magnesium sulfate to remove the solvent. The acquired solid was recrystallized with ethyl acetate, preparing 4.5 g (yield: 48.7%) of a white solid M-2. The solid M-2 had a melting point at a temperature ranging from 218 to 219° C.

Synthesis Example 3

Synthesis of M-3

[Reaction Scheme 3]

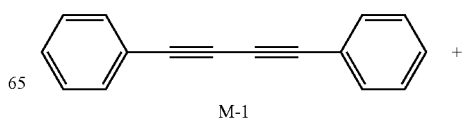

-continued

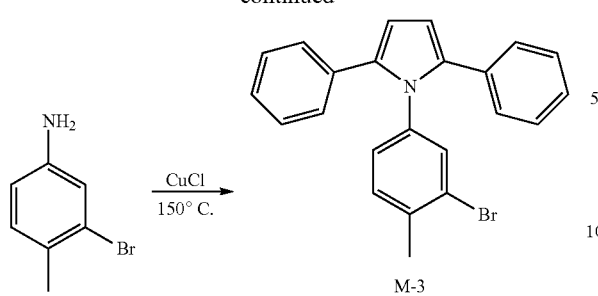

5 g (24.7 mmol) of 1,4-diphenylbutadiene (M-1), 5.06 g (27.1 mmol) of 3-bromo-4-methylaniline, and 0.58 g (5.9 mmol) of copper (I) chloride were put in a 250 ml round-bottomed flask under an argon atmosphere. The mixture was agitated for reaction at 150° C. for 5 hours. After the reaction, the reactant was cooled down and dissolved in methylene chloride. The resulting solution was washed several times with 5% hydrochloric acid. The prepared organic solution was washed several times with water, and then dried with anhydrous magnesium sulfate to dry the solvent. The acquired solid was recrystallized with ethyl acetate, acquiring 5.94 g (yield: 62%) of a white solid M-3.

Synthesis Example 4

Synthesis of M-4

[Reaction Scheme 4]

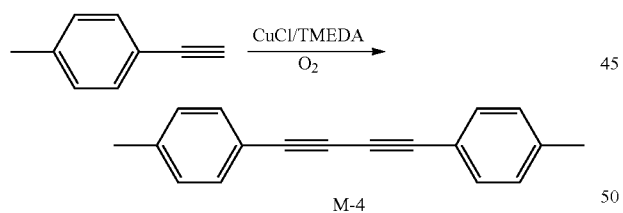

25 g (0.21 mol) of 1-ethynyl-4-methylbenzene, 1.2 g (12.1 mmol) of copper (I) chloride, and 1.4 g (12 mmol) of N,N,N',N'-tetramethylethylenediamine (TMEDA) were added to 200 ml of an acetone solvent in a 500 ml round-bottomed flask having a mechanical agitator. The mixture was agitated at room temperature for 1 hour while being bubbled with oxygen. After the reaction, the resulting product was dried under reduced pressure to remove the solvent, and then precipitated in a 5% hydrochloric acid aqueous solution, acquiring a white solid. The white solid was filtrated. The solid was recrystallized in ethanol and dried, preparing 18.8 g (yield: 78%) of a transparent crystal M-4. It had a melting point at a temperature ranging from 182 to 183° C.

Synthesis Example 5

Synthesis of M-5

[Reaction Scheme 5]

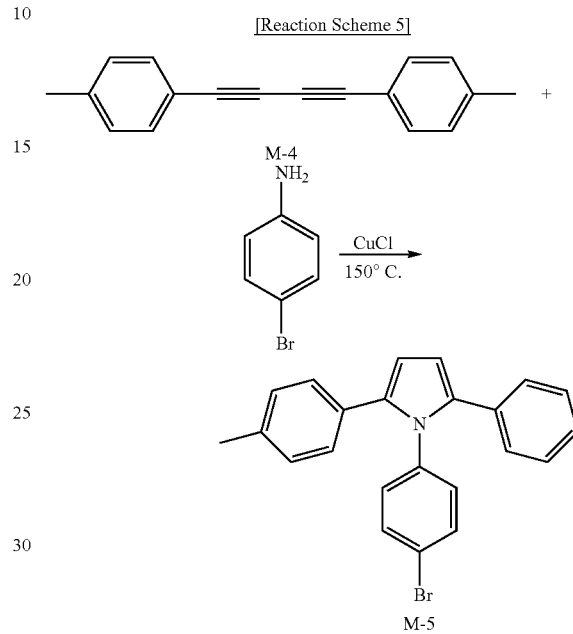

5 g (21.7 mmol) of 1,4-bis(p-tolyl)butadiene (M-4), 4.1 g (23.8 mmol) of p-bromoaniline, and 0.51 g (5.2 mmol) of copper (I) chloride were put in a 250 ml round-bottomed flask and agitated for reaction at 150° C. for 5 hours under an argon atmosphere. After the reaction, the reactant was cooled down, dissolved in methylene chloride, and then washed several times with 5% hydrochloric acid. The prepared organic solution was washed several times with water again, and then dried with anhydrous magnesium sulfate to remove the solvent. Then, the acquired solid was recrystallized with ethyl acetate, preparing 5.5 g (yield: 63%) of a white solid M-5.

Synthesis Example 6

Synthesis of M-6

[Reaction Scheme 6]

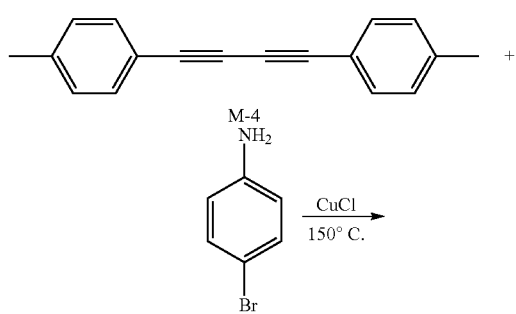

-continued

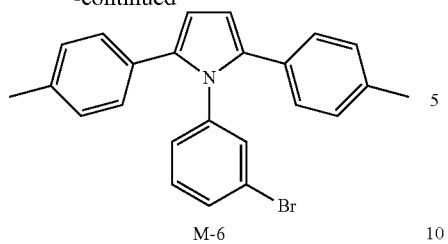

M-6

6 g (26 mmol) of 1,4-bis(p-tolyl)butadiene M-4, 4.9 g (28 mmol) of 3-bromoaniline, and 0.61 g (6.2 mmol) of copper (I) chloride were put in a 250 ml round-bottomed flask and agitated for reaction at 150° C. for 5 hours under an argon atmosphere. After the reaction, the reactant was cooled down, dissolved in methylene chloride, and then washed several times washed with 5% hydrochloric acid. The prepared organic solution was washed several times with water and dried with anhydrous magnesium sulfate to remove the solvent. Then, the solid was purified in a solvent of methylene chloride/hexane mixed in a volume ratio of 1:2 through silica gel column chromatography, acquiring 5.8 g of a white M-6 (yield: 66.4%).

In the following Examples 1 to 10, a pyrrole compound was prepared.

Example 1

Synthesis of M-7

[Reaction Scheme 7]

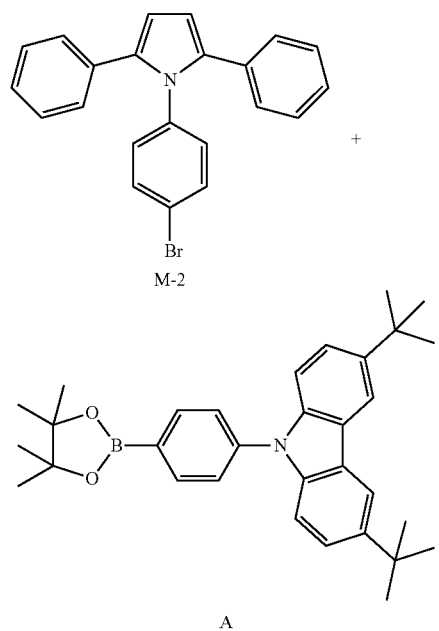

-continued

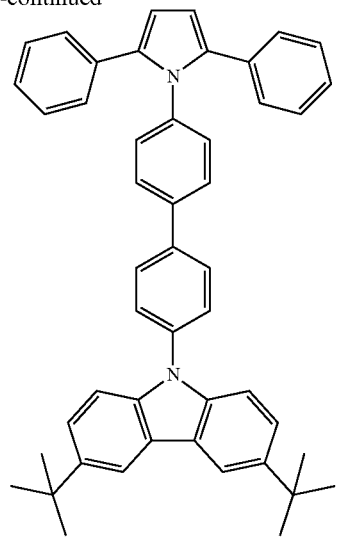

M-7

1.5 g (4.0 mmol) of M-2, 2.13 g (4.4 mmol) of a material A and 0.14 g (0.12 mmol) of tetrakis(triphenylphosphine)palladium were dissolved in 30 mL tetrahydrofuran (THF) in a 100 ml round-bottomed flask having a thermometer, a reflux condenser, and an agitator under an argon atmosphere. 15 mL of 20% tetratriethylammonium hydroxide was added thereto. The resulting mixture was refluxed for reaction at 75° C. for 24 hours.

After the reaction, the reactant was cooled down to room temperature and extracted with methylene chloride. The extract was washed several times with water.

Next, the washed reactant was treated with anhydrous magnesium sulfate to remove moisture and filtered to remove the solvent.

The resulting reactant was purified with a solvent of methylene chloride/hexane mixed in a volume ratio of 1:3 through silica gel column chromatography and then recrystallized with a solvent of methylene chloride/hexane mixed in a volume ratio of 1:3, acquiring 1.6 g of a white M-7 (yield: 61.6%). When the white M-7 was fabricated into a thin film, it had a maximum light-emitting wavelength of 405 nm.

Example 2

Synthesis of M-8

[Reaction Scheme 8]

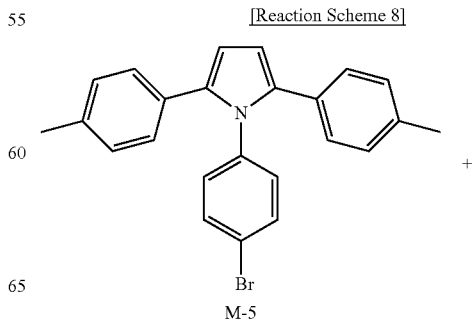

M-5

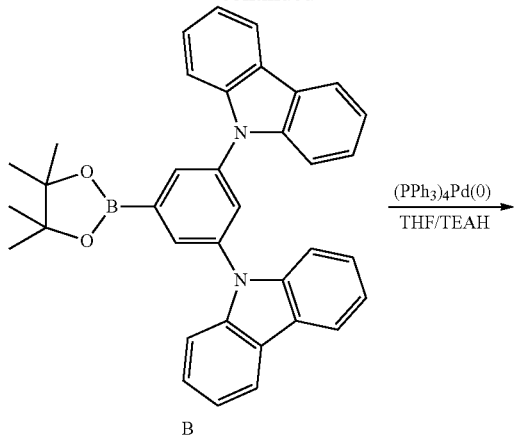

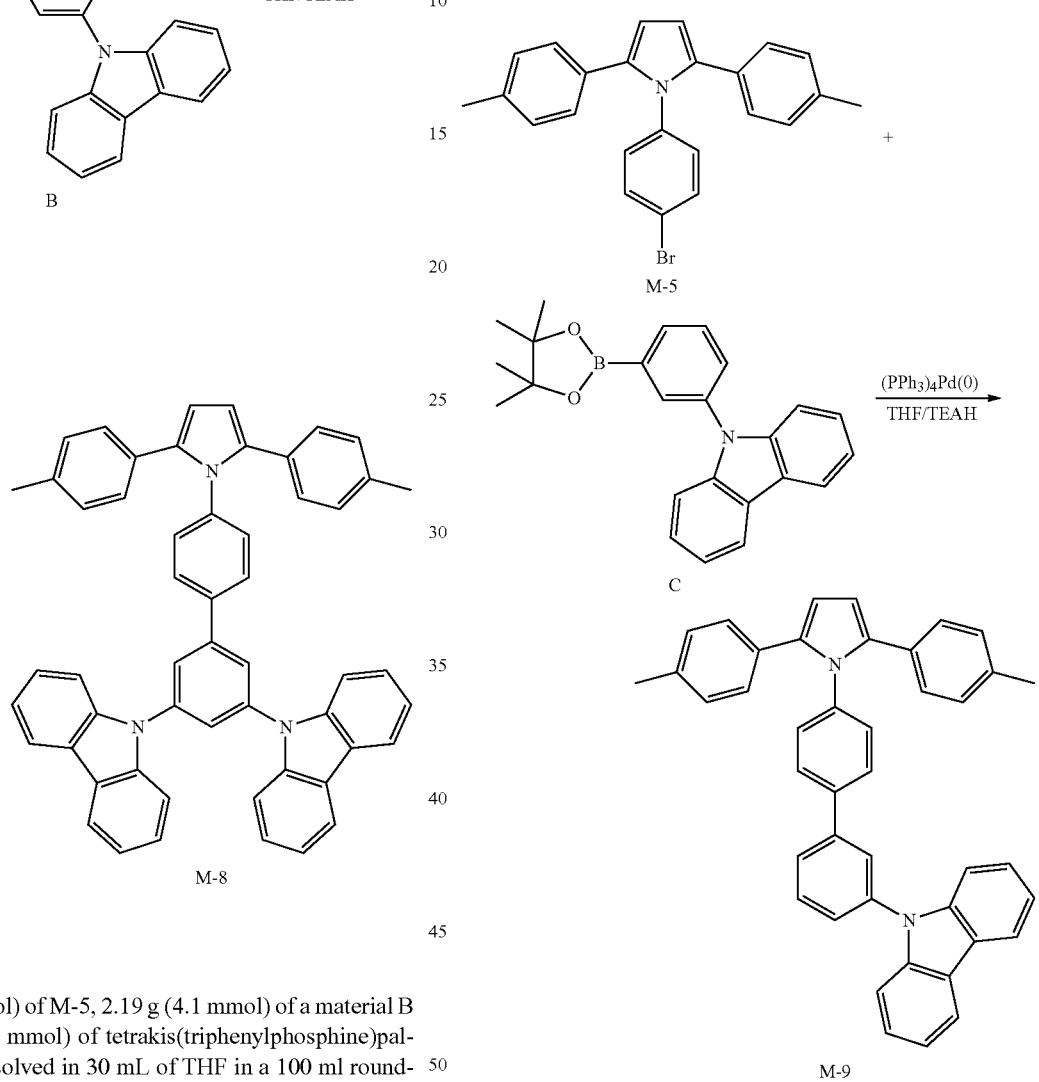

1.5 g (3.7 mmol) of M-5, 2.19 g (4.1 mmol) of a material B and 0.13 g (0.11 mmol) of tetrakis(triphenylphosphine)palladium were dissolved in 30 mL of THF in a 100 ml round-bottomed flask having a thermometer, a reflux condenser, and an agitator under an argon atmosphere. 15 mL of 20% tetratriethylammonium hydroxide was added thereto. The resulting mixture was refluxed for reaction at 75° C. for 24 hours.

After the reaction, the reactant was cooled down to room temperature and extracted several times with methylene chloride. The extract was washed several times with water.

Then, the washed reactant was treated with anhydrous magnesium sulfate to remove moisture and filtered to remove the solvent.

The resulting reactant was purified with a solvent of methylene chloride/hexane mixed in a volume ratio of 1:3 through silica gel column chromatography and then recrystallized in a solvent of methylene chloride/hexane mixed in a volume ratio of 1:3, acquiring 1.7 g of a white M-8 (yield: 62.7%). When the white M-8 was fabricated into a thin film, it had a maximum light emitting wavelength of 442 nm.

Example 3

Synthesis of M-9

1.5 g (3.7 mmol) of M-5, 1.51 g (4.1 mmol) of a material C and 0.13 g (0.11 mmol) of tetrakis(triphenylphosphine)palladium were dissolved in 30 mL of THF in a 100 ml round-bottomed flask having a thermometer, a reflux condenser, and an agitator under an argon atmosphere. Then, 15 mL of 20% tetratriethylammonium hydroxide was added thereto. The resulting mixture was refluxed for reaction at 75° C. for 24 hour.

After the reaction, the reactant was cooled to room temperature and extracted several times with methylene chloride. The extract was several times washed with water.

Then, the washed reactant was treated with anhydrous magnesium sulfate to remove the moisture and filtered to remove the solvent.

The resulting reactant was purified with a solvent of methylene chloride/hexane mixed in a volume ratio of 1:3 through silica gel column chromatography and then recrystallized with a solvent of methylene chloride/hexane mixed in a volume ratio of 1:3, preparing 1.5 g of a white M-9 (yield: 71.4%). When the white M-9 was fabricated into a thin film, it had a maximum light emitting wavelength of 422 nm.

Example 4

Synthesis of M-10

[Reaction Scheme 10]

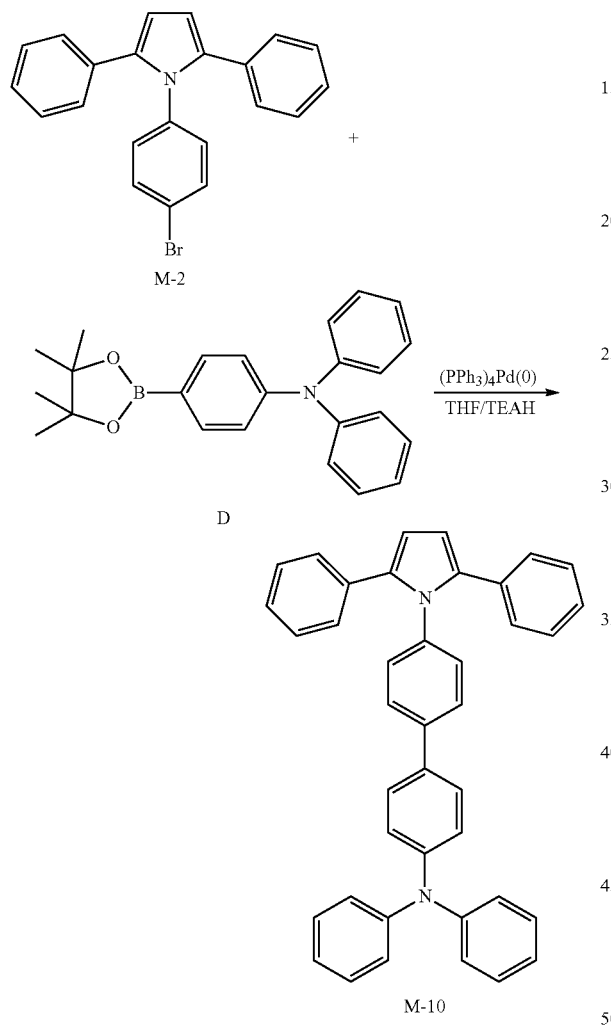

1.5 g (4.0 mmol) of M-2, 1.63 g (4.4 mmol) of a material D and 0.13 g (0.11 mmol) of tetrakis(triphenylphosphine)palladium were dissolved in 30 mL of THF in a 100 ml round-bottomed flask having a thermometer, a reflux condenser, and an agitator under an argon atmosphere. Then, 15 mL of 20% tetratriethylammonium hydroxide was added thereto. The resulting mixture was refluxed for reaction at 75° C. for 24 hours.

After the reaction, the reactant was cooled to room temperature and extracted several times with methylene chloride. The extract was washed several times with water.

The, the washed reactant was treated with anhydrous magnesium sulfate to remove the moisture and filtered to remove the solvent.

The resulting reactant was recrystallized with a solvent of methylene chloride/hexane mixed in a volume ratio of 1:3, preparing 1.2 g of a white M-10 (yield: 55.8%). When the white M-10 was fabricated into a thin film, it had a maximum light emitting wavelength of 398 nm.

Example 5

Synthesis of M-11

[Reaction Scheme 11]

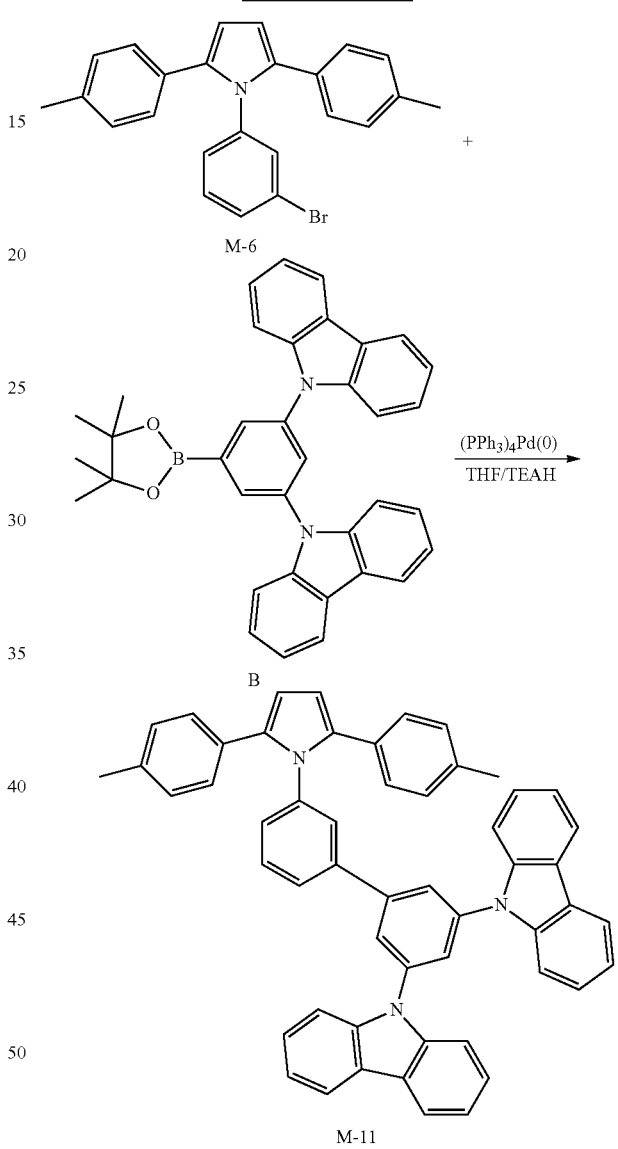

1.5 g (3.7 mmol) of M-6, 2.19 g (4.1 mmol) of a material B and 0.13 g (0.11 mmol) of tetrakis(triphenylphosphine)palladium were dissolved in 30 mL of THF in a 100 ml round-bottomed flask having a thermometer, a reflux condenser, and an agitator under an argon atmosphere. Then, 15 mL of 20% tetratriethylammonium hydroxide was added thereto. The resulting mixture was refluxed for reaction at 75° C. for 24 hours.

After the reaction, the reactant was cooled to room temperature and extracted several times with methylene chloride. Then, the washed reactant was treated with anhydrous magnesium sulfate to remove the moisture and filtered to remove the solvent.

The resulting reactant was purified with a solvent of methylene chloride/hexane mixed in a volume ratio of 1:3 through silica gel column chromatography and recrystallized with a solvent of methylene chloride/hexane mixed in a volume ratio of 1:3, preparing 1.95 g of a white M-11 (yield: 72%). When the white M-11 was fabricated into a thin film, it had a maximum light emitting wavelength of 423 nm.

Example 6

Synthesis of M-12

Then, the washed reactant was treated with anhydrous magnesium sulfate to remove the moisture and filtered to remove the solvent.

The resulting reactant was recrystallized with a solvent of methylene chloride/hexane mixed in a volume ratio of 1:3, preparing 1.86 g of a white M-12 (yield: 74%). When the M-12 was fabricated into a thin film, it had a maximum light emitting wavelength of 405 nm.

Example 7

Synthesis of M-13

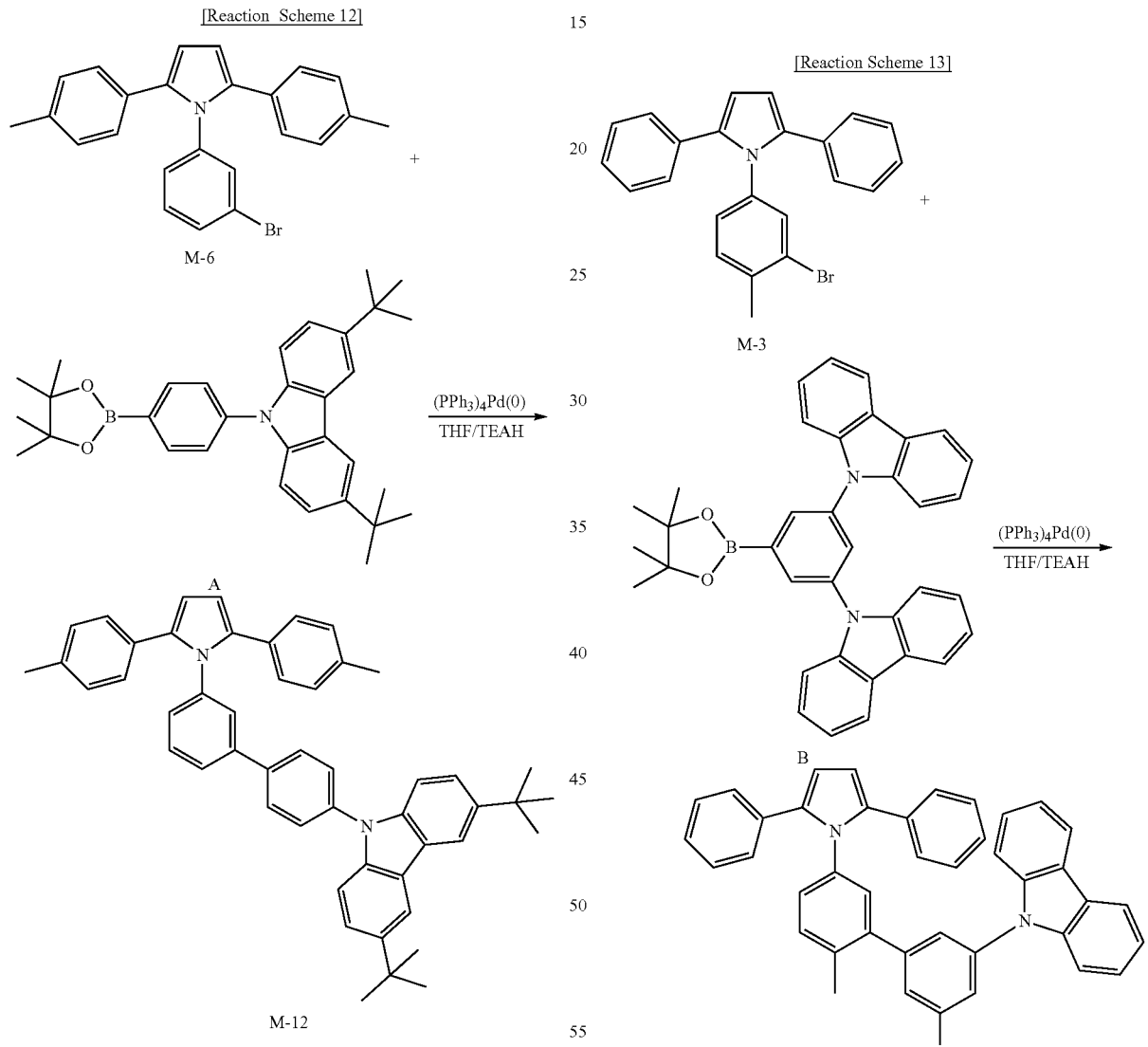

1.5 g (3.7 mmol) of M-6, 1.98 g (4.1 mmol) of a material A and 0.13 g (0.11 mmol) of tetrakis(triphenylphosphine)palladium were dissolved in 30 mL of THF in a 100 ml round-bottomed flask having a thermometer, a reflux condenser, and an agitator under an argon atmosphere. Then, 15 mL of 20% tetratriethylammonium hydroxide was added thereto. The resulting mixture was refluxed for reaction at 75° C. for 24 hours.

After the reaction, the reactant was cooled to room temperature and extracted several times with methylene chloride. The extract was washed several times with water.

1.5 g (3.8 mmol) of M-3, 2.27 g (4.2 mmol) of a material B and 0.13 g (0.11 mmol) of tetrakis(triphenylphosphine)palladium were dissolved in 30 mL of THF in a 100 ml round-bottomed flask having a thermometer, a reflux condenser, and an agitator under an argon atmosphere. Then, 15 mL of 20% tetratriethylammonium hydroxide was added thereto. The mixture was refluxed for reaction at 75° C. for 24 hours.

After the reaction, the reactant was cooled to room temperature and extracted several times with methylene chloride. The extract was washed several times with water.

Then, the washed reactant was treated with anhydrous magnesium sulfate to remove the moisture and filtered to remove the solvent.

The resulting reactant was recrystallized with a solvent of methylene chloride/hexane mixed in a volume ratio of 1:3, preparing 1.87 g of a white M-13 (yield: 67.7%). When the white M-13 was fabricated into a thin film, it had a maximum light emitting wavelength of 391 nm.

Example 8

Synthesis of M-14

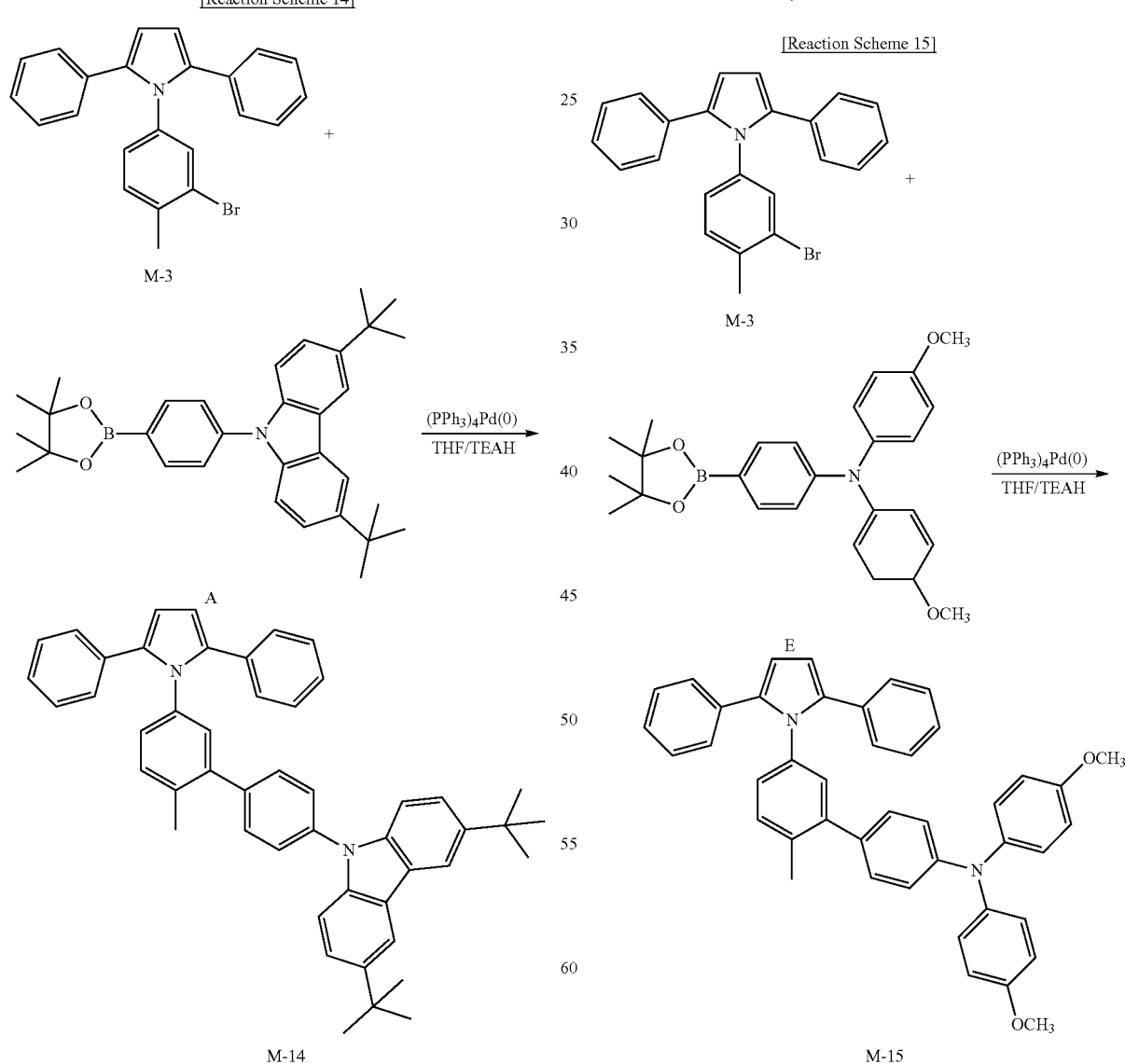

1.5 g (3.8 mmol) of M-3, 1.96 g (4.0 mmol) of a material A and 0.13 g (0.11 mmol) of tetrakis(triphenylphosphine)pal-ladium were dissolved in 30 mL of THF in a 100 ml round-bottomed flask having a thermometer, a reflux condenser, and an agitator under an argon atmosphere. Then, 15 mL of 20% tetratriethylammonium hydroxide was added thereto. The mixture was refluxed for reaction at 75° C. for 24 hours.

After the reaction, the reactant was cooled to room temperature and extracted several times with methylene chloride. The extract was washed several times with water.

Next, the reactant was treated with anhydrous magnesium sulfate to remove the moisture and filtered to remove the solvent.

The reactant was purified with a solvent of methylene chloride/hexane mixed in a volume ratio of 1:3 volume ratio through silica gel column chromatography, preparing a white M-14 of 1.33 g (yield: 52%). When the white M-14 was fabricated into a thin film, it had a maximum light emitting wavelength of 378 nm.

Example 9

Synthesis of M-15

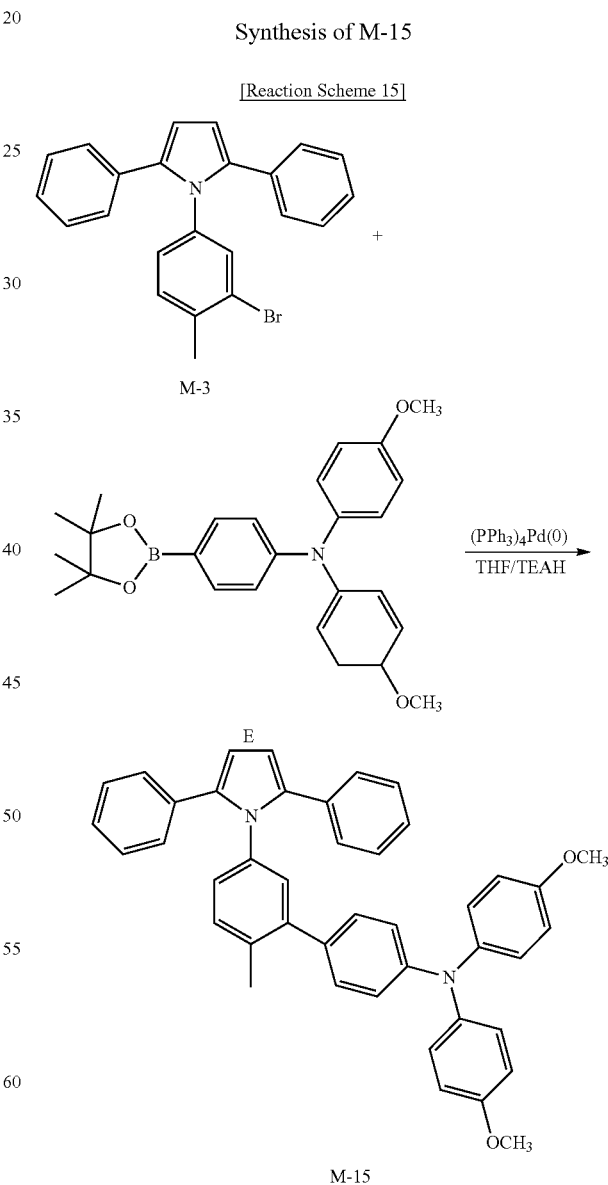

1.5 g (3.8 mmol) of M-3, 1.99 g (4.6 mmol) of a material E, and 0.13 g (0.11 mmol) of tetrakis(triphenylphosphine)palladium were dissolved in 30 mL of THF in a 100 ml round-bottomed flask having a thermometer, a reflux condenser, and an agitator under an argon atmosphere. Then, 15 mL of 20% tetratriethylammonium hydroxide was added thereto. The mixture was refluxed for reaction at 75° C. for 24 hours.

After the reaction, the reactant was cooled to room temperature, and extracted several times with methylene chloride. The extract was washed several times with water.

Then, the washed reactant was treated with anhydrous magnesium sulfate to remove the moisture, and then filtered to remove the solvent.

The resulting reactant was purified with a solvent of methylene chloride/hexane mixed in a volume ratio of 2:1 through silica gel column chromatography and recrystallized with a solvent of methylene chloride/hexane mixed in a volume ratio of 2:1, preparing 1.5 g of a white M-15 (yield: 63.4%). When the white M-15 was fabricated into a thin film, it had a maximum light emitting wavelength of 417 nm.

Example 10

Synthesis of M-16

[Reaction Scheme 16]

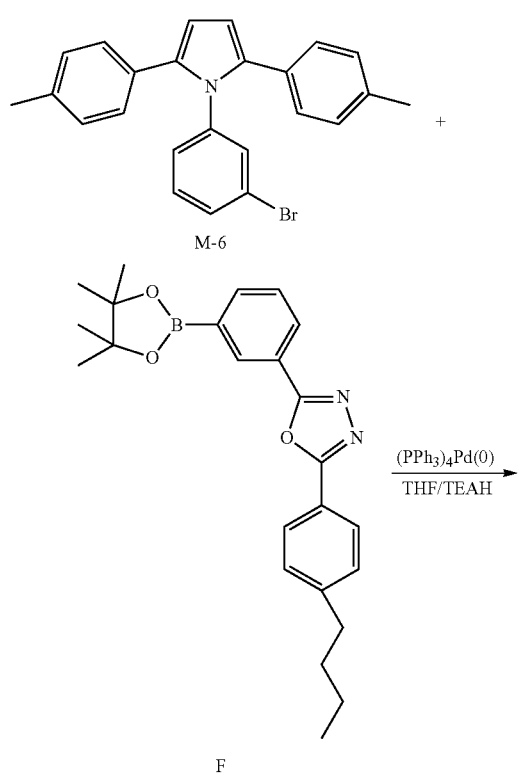

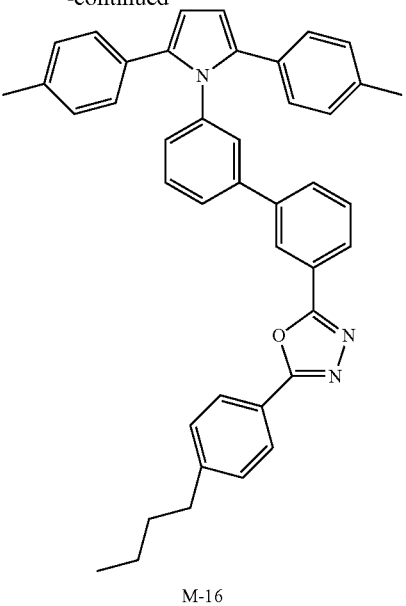

M-16

1.2 g (3.0 mmol) of M-6, 1.32 g (3.2 mmol) of a material F, and 0.13 g (0.11 mmol) of tetrakis(triphenylphosphine)palladium were dissolved in 30 mL of THF in a 100 ml round-bottomed flask having a thermometer, a reflux condenser, and an agitator under an argon atmosphere. Then, 15 mL of 20% tetratriethylammonium hydroxide was added thereto. The mixture was refluxed for reaction at 75° C. for 24 hours.

After the reaction, the reactant was cooled to room temperature and extracted several times with methylene chloride. The extract was washed several times with water.

Then, the washed reactant was treated with anhydrous magnesium sulfate to remove the moisture and filtered to remove the solvent.

The resulting product was recrystallized with a solvent of methylene chloride/hexane mixed in a volume ratio of 1:3, preparing 1.3 g of a white M-16 (yield: 72.7%). When the white M-16 was fabricated into a thin film, it had a maximum light emitting wavelength of 435 nm.

Analysis and Characteristic Measurement of the Compounds

Figure 2:
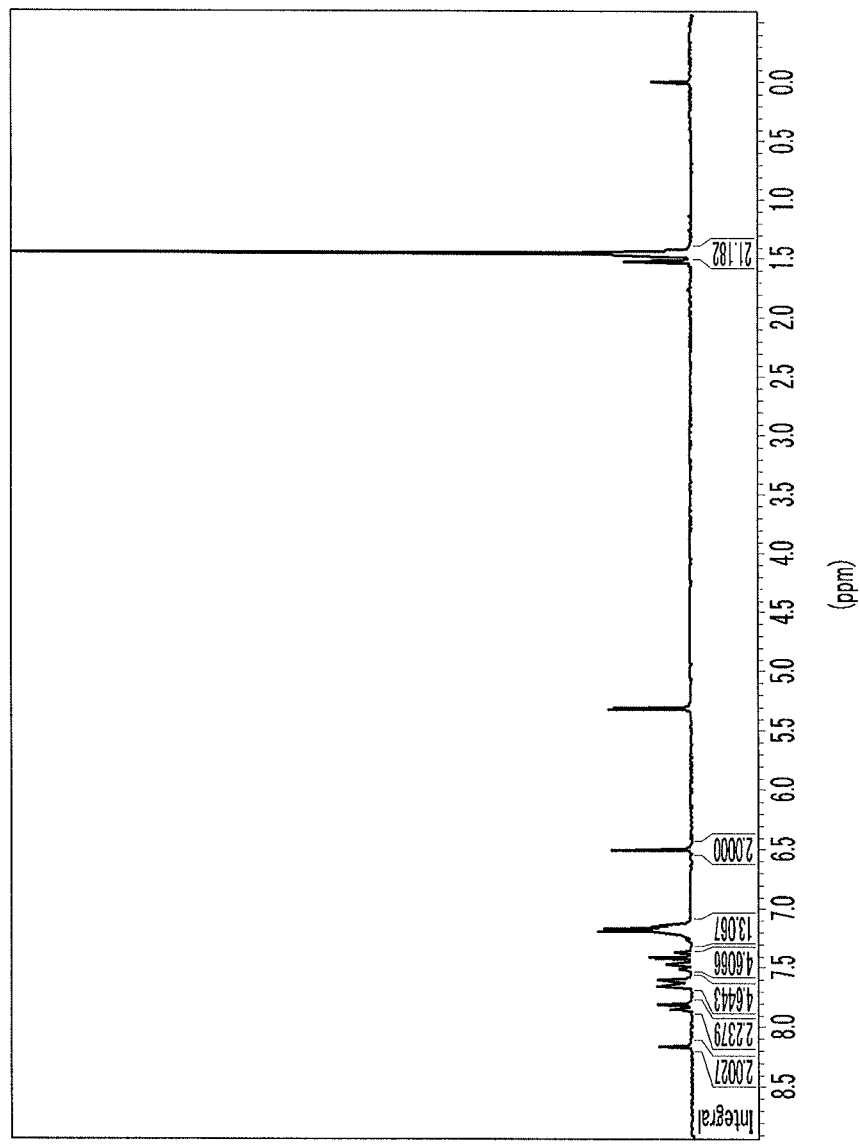
FIG. 2 illustrates a $^1$H-NMR spectrum of compound M-7 according to Example 1.
Figure 3:
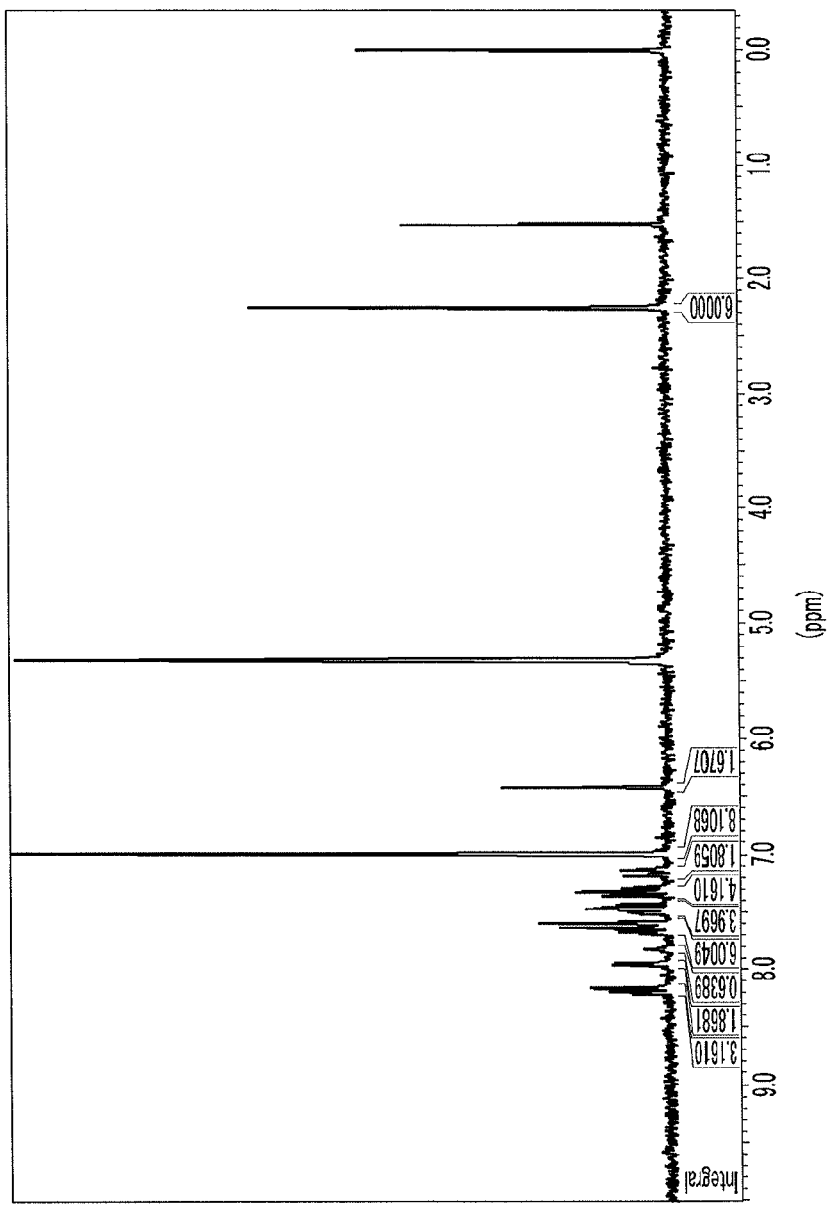
FIG. 3 illustrates a $^1$H-NMR spectrum of compound M-8 according to Example 2.
Figure 4:
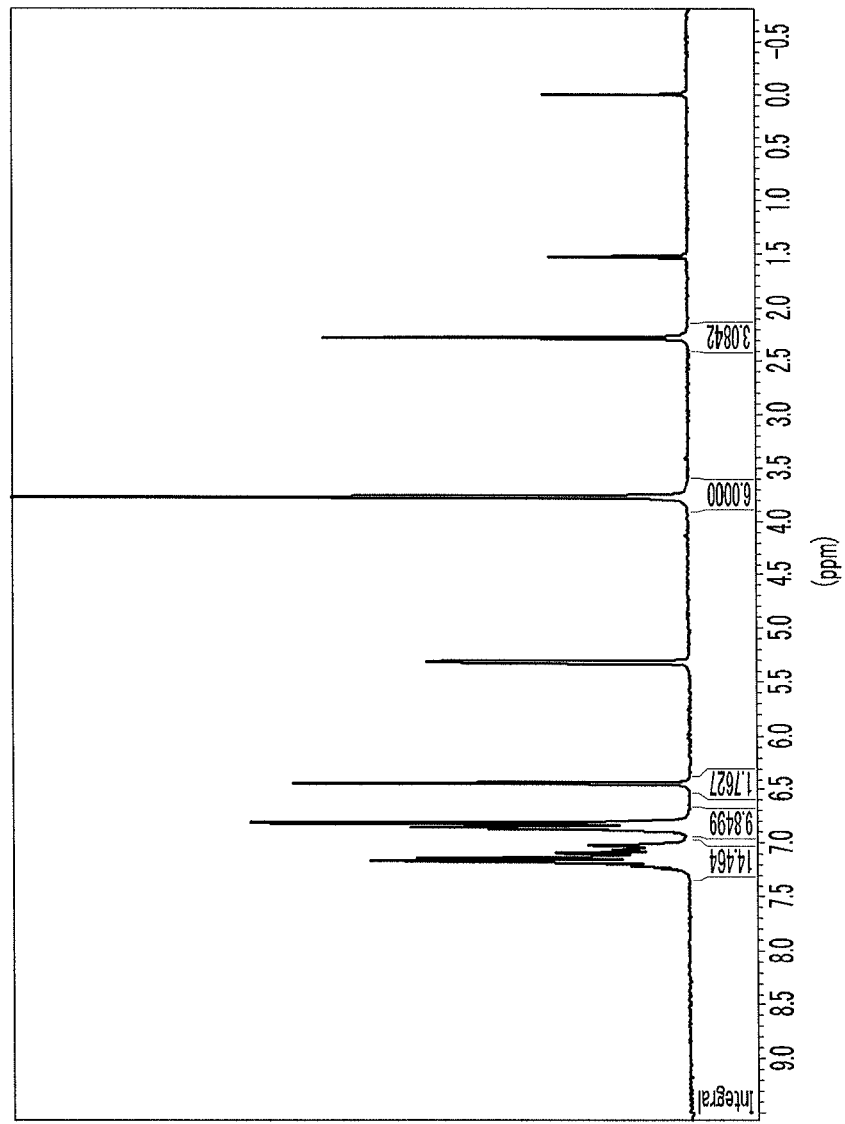
FIG. 4 illustrates a $^1$H-NMR spectrum of compound M-15 according to Example 9.
Figure 5:
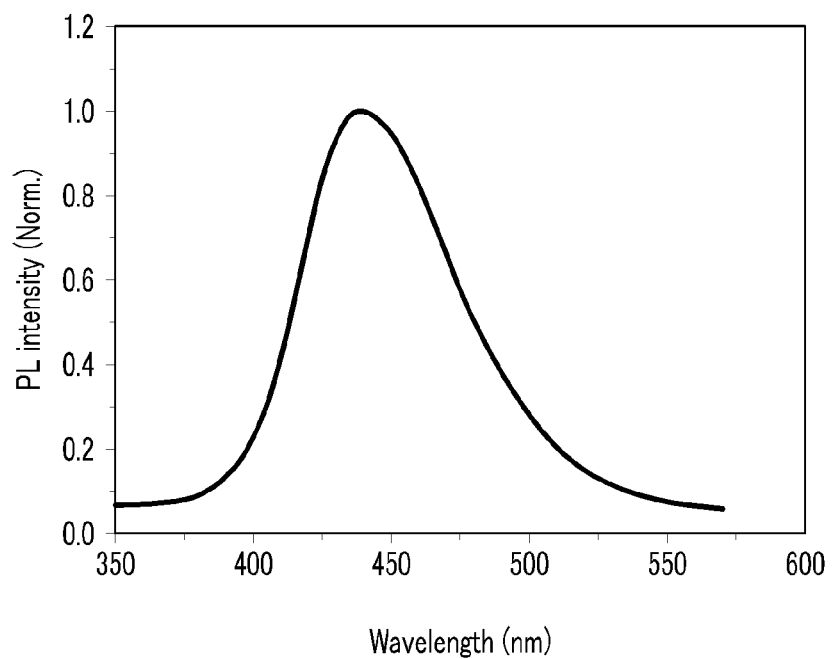
FIG. 5 illustrates a graph showing photoluminescence (PL) of compound M-8 according to Example 2.

The compounds M-7 to M-16 of Examples 1 to 10 were dissolved in a $CD_2Cl_2$ solvent for structural analysis and measured regarding $^1$H-NMR by using 300 MHz NMR equipment. FIG. 2 illustrates the $^1$H-NMR result of M-7 according to Example 1, FIG. 3 illustrates the $^1$H-NMR result of M-8 according to Example 2, and FIG. 4 illustrates the $^1$H-NMR result of M-15 according to Example 9. The compounds M-7 to M-16 were formed in a thin film on a glass substrate to measure fluorescent characteristics and then measured regarding PL (photoluminescence) wavelength by using HITACHI F-4500. FIG. 5 illustrates the PL wavelength measurement result of compound M-8 according to Example 2.

Referring to FIG. 5, M-8 exhibited a maximum light emitting wavelength of 442 nm when fabricated in the thin film.

Examples 11 to 20

Fabrication of Organic Light Emitting Diodes

An ITO substrate was used as an anode; and poly(3,4-ethylenedioxy-thiophene) (PEDOT) was spin-coated on the substrate.

Next, an emission layer was spin-coated on the PEDOT by using the compounds M-7 to M-16 according to Examples 1 to 10 as a host and doping 7 wt % of $Ir(phq)_2acac$.

On the emission layer, BAlq was vacuum-deposited to be 50 Å thick, forming a hole blocking layer.

Next, $Alq_3$ was vacuum-deposited to be 200 Å thick on the emission layer, forming an electron transport layer (ETL).

On the electron transport layer (ETL), LiF at 10 Å and Al at 1000 Å were sequentially vacuum-deposited to fabricate a cathode, completing an organic light emitting diode.

The organic light emitting diode had five organic thin layers. In particular, it had Al (1000 Å)/LiF (10 Å)/$Alq_3$ (200 Å)/BAlq (50 Å)/EML (M-14:$Ir(phq)_2acac$)/PEDOT/ITO (1500 Å).

Performance Measurement of Organic Light Emitting Diodes

The organic light emitting diodes of Examples 11 to 21 were measured regarding current density and luminance changes depending on voltage change. In particular, the measurements were performed as follows.

1) Current Density Change Measurement Depending on Voltage

The organic light emitting diodes were respectively measured regarding a current in a unit device by using a current-voltage meter (Keithley 2400) while their voltages were increased from 0 V. Each current value was divided by area, measuring current density.

Figure 6:
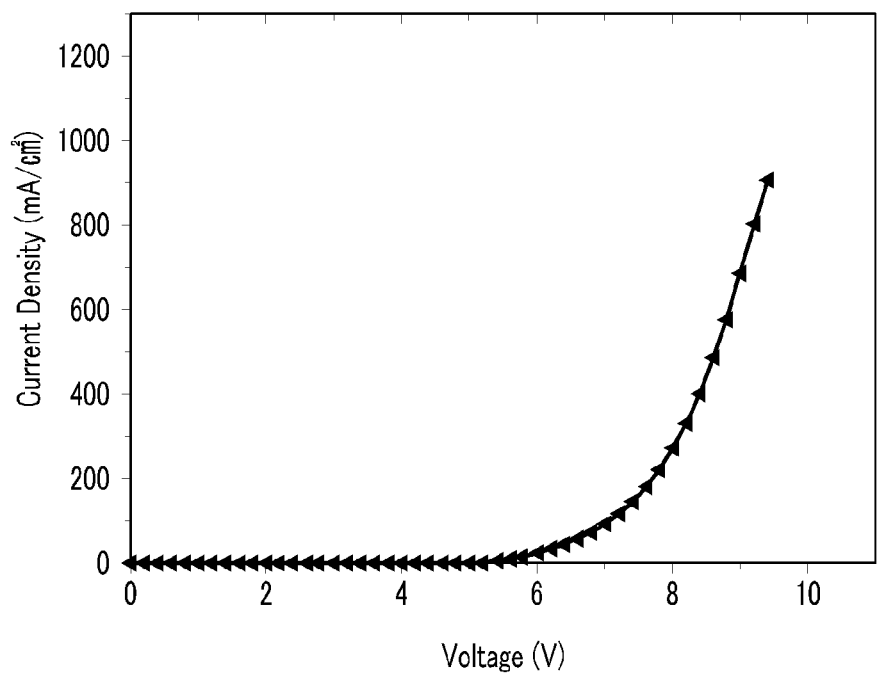
FIG. 6 illustrates a graph showing current density of the organic light emitting diode including compound M-14 according to Example 18.

The organic light emitting diode of Example 18 was fabricated by using the compound M-14. FIG. 6 illustrates current density change result thereof depending on voltage change.

2) Luminance Change Measurement Depending on Voltage Change

The organic light emitting diode of Example 18 including the compound M-14 was measured regarding luminance while its voltage was increased from 0 V by using a luminance meter (Minolta Cs-1000A). The result is shown in FIG. 7.

3) Luminous Efficiency Measurement Depending on Luminance Change

The organic light emitting diode of Example 18 including the compound M-14 was measured regarding current efficiency depending on luminance change. The result is provided in FIG. 8.

Figure 7:
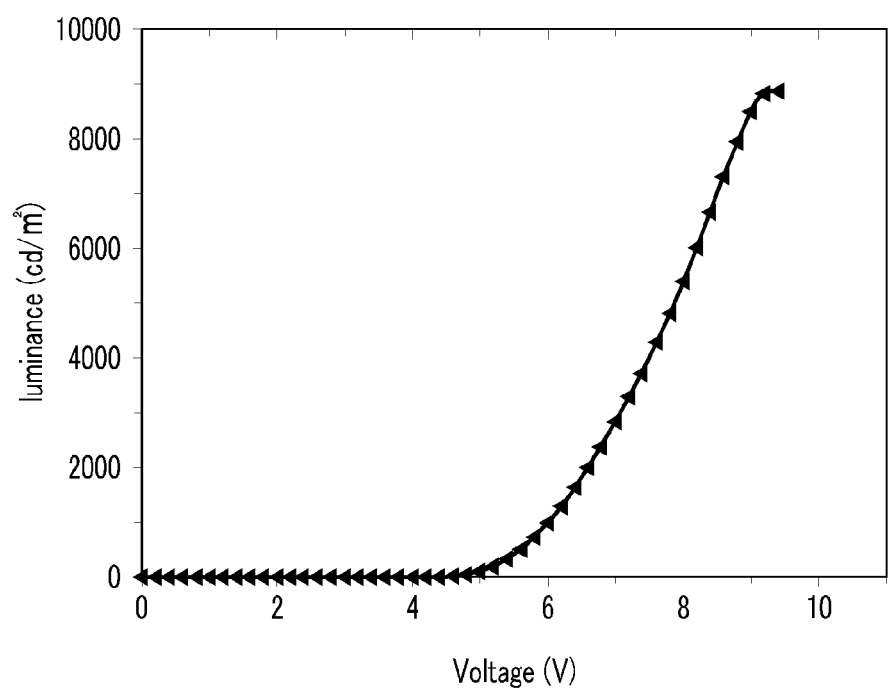
FIG. 7 illustrates a graph showing luminance versus voltage of the organic light emitting diode including compound M-14 according to Example 18.
Figure 8:
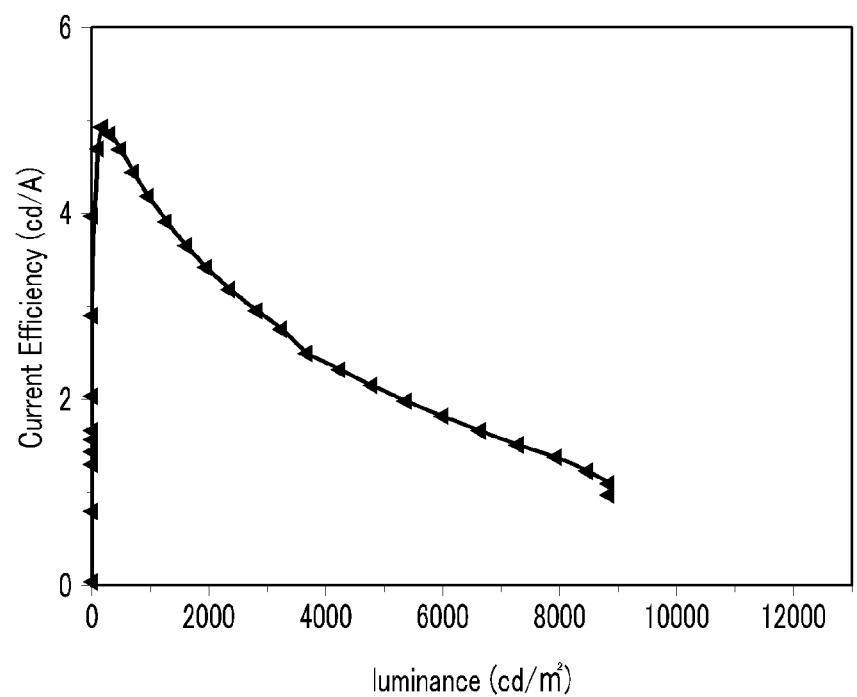
FIG. 8 illustrates a graph showing luminance versus luminous efficiency of the organic light emitting diode including compound M-14 according to Example 18.

Referring to FIGS. 6 to 8, including the compound M-14 turned out to decrease driving voltage but improve luminance and efficiency as a host material for an organic light emitting diode.

Electrochemical Characteristic Measurement

The compounds M-7 to M-16 were measured regarding electrochemical characteristic by using cyclic voltammetry equipment. The results are provided in Table 1.

TABLE 1

| | Examples | | | | | | | | | |
|---|---|---|---|---|---|---|---|---|---|---|
| | 1 | 2 | 3 | 4 | 5 | 6 | 7 | 8 | 9 | 10 |
| | M-7 | M-8 | M-9 | M-10 | M-11 | M-12 | M-13 | M-14 | M-15 | M-16 |
| HOMO (eV) | −5.60 | −5.35 | −5.34 | −5.35 | −5.36 | −5.32 | −5.41 | −5.43 | −5.15 | −5.33 |
| LUMO (eV) | −2.24 | −1.95 | −1.90 | −2.17 | −1.88 | −1.98 | −1.95 | −2.06 | −1.96 | −1.87 |

Referring to Table 1, the compounds M-7 to M-16 according to Examples 1 to 10 exhibited characteristics making them suitable for use as a hole transporting layer and an electron blocking layer.

By way of summation and review, the efficiency and properties of the light emission diodes may be dependent on the host material in the emission layer. Typically, the organic host material may include a material including naphthalene, anthracene, phenanthrene, tetracene, pyrene, benzopyrene, chrysene, pycene, carbazolyl, fluorenyl, biphenyl, terphenyl, triphenylene oxide, dihalobiphenyl, trans-stilbene, and 1,4-diphenylbutadiene.

Generally, the host material may include 4,4-N,N-dicarbazoiebiphenyl (CBP) having a glass transition temperature of 110° C. or less and a thermal decomposition temperature of 400° C. or less, and having low thermal stability and excessively high symmetry. Thus, it may tend to be easily crystallized and may cause a short circuit and a pixel defect according to the thermal resistance test results of the devices.

In addition, most host materials including CBP may have a greater hole transporting property than electron transporting property. For example, as the injected hole transportation is faster than the injected electron transportation, the excitons may be ineffectively formed in the emission layer. Therefore, the resultant device may exhibit deteriorated luminous efficiency.

Therefore, the embodiments provide a pyrrole compound having high charge transporting properties, film stability, and triplet excitation energy ($T_1$) so as to be applicable to a host material, a hole transport material, or an electron blocking material.

The pyrrole compound according to an embodiment may be used as a host material, a hole transport material, or an electron blocking material to be applicable to an organic thin layer such as an organic emission layer, a hole transport layer (HTL), an electron blocking layer, and so on for an organic photoelectric device.

The embodiments provide a pyrrole compound that easily dissolves in an organic solvent and is applicable as a host material for an emission layer, a hole transport material, or an electron blocking material for an organic photoelectric device. The pyrrole compound according to an embodiment may emit fluorescence and phosphorescence at a red wavelength through a blue wavelength.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A pyrrole compound for an organic photoelectric device, the pyrrole compound being represented by the following General Formula 1:

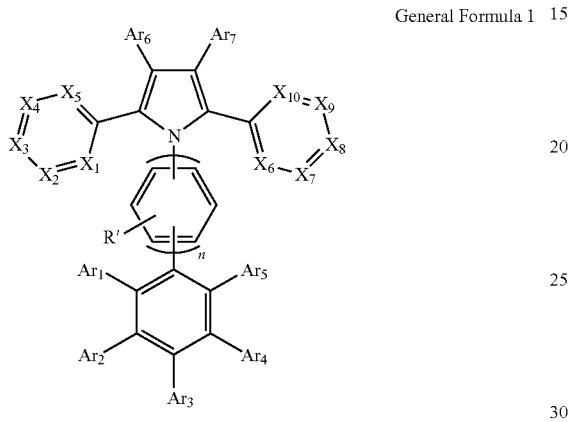

General Formula 1 wherein, in General Formula 1,

R' includes at least one selected from the group of hydrogen and a C1 to C6 alkyl, $Ar_1$ to $Ar_5$ each independently include at least one selected from the group of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, provided that $Ar_1$ to $Ar_5$ are neither a pyridyl group nor a pyrrole derivative group, $Ar_6$ and $Ar_7$ each independently include at least one selected from the group of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, $X_1$ to $X_{10}$ each independently include one selected from the group of CR" and N, where R" includes at least one of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, n is an integer of 1 or 2, and at least one of $Ar_1$ to $Ar_5$ is represented by one of Chemical Formulae 1 to 8, 11 to 13, 17, 19, 20, and 22 to 29:

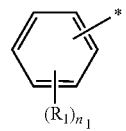

[Chemical Formula 1]

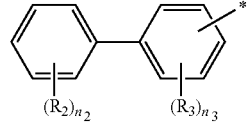

[Chemical Formula 2]

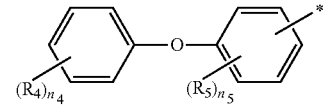

[Chemical Formula 3]

-continued
[Chemical Formula 4]
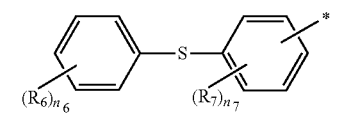
[Chemical Formula 5]
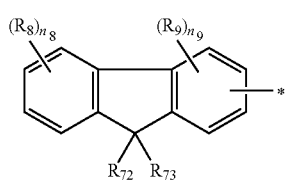
[Chemical Formula 6]
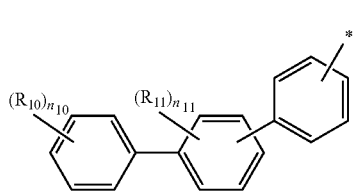
[Chemical Formula 7]
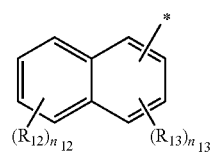
[Chemical Formula 8]
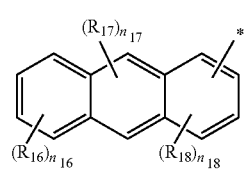
[Chemical Formula 11]
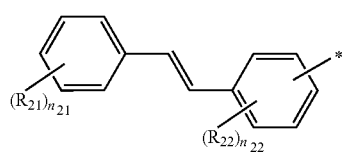
[Chemical Formula 12]
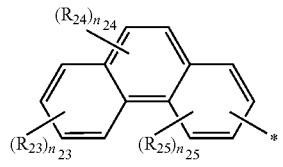
[Chemical Formula 13]
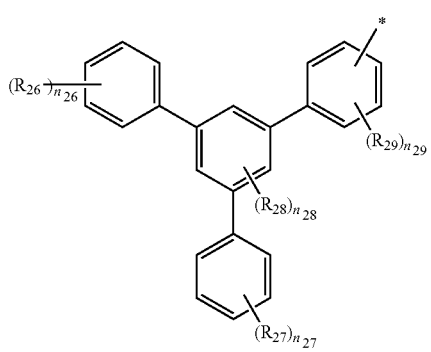
-continued
[Chemical Formula 17]
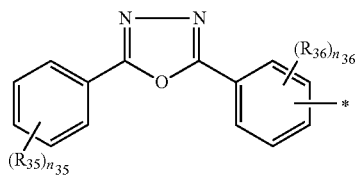
[Chemical Formula 19]
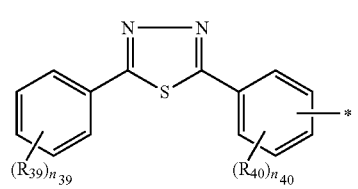
[Chemical Formula 20]
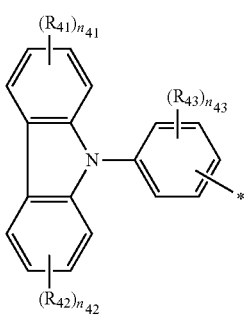
[Chemical Formula 22]
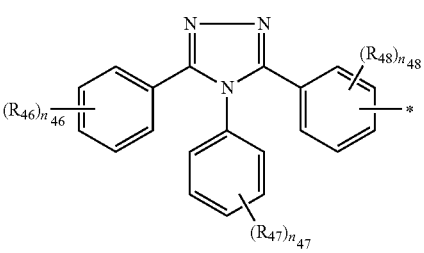
[Chemical Formula 23]
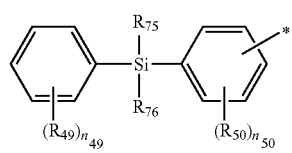
[Chemical Formula 24]
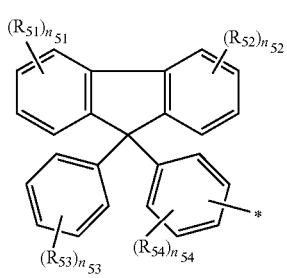

-continued

[Chemical Formula 25]

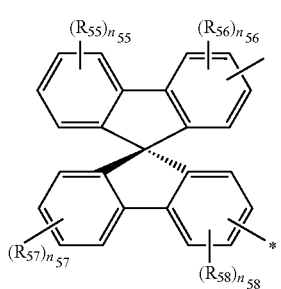

[Chemical Formula 26]

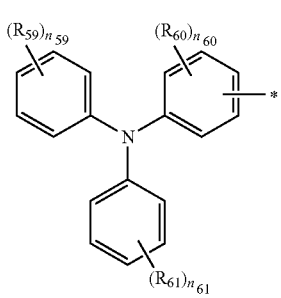

[Chemical Formula 27]

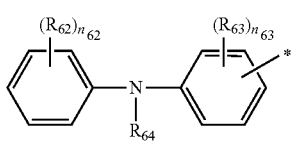

[Chemical Formula 28]

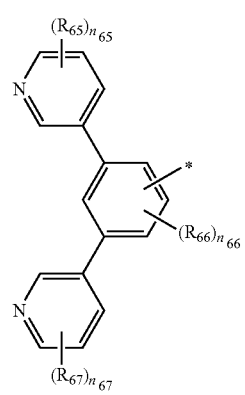

[Chemical Formula 29]

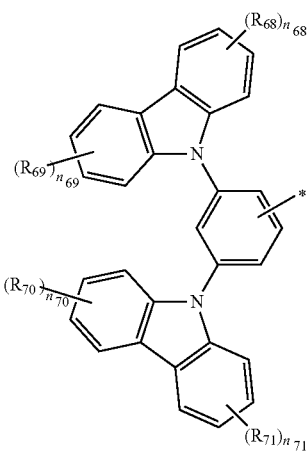

wherein, in Chemical Formulae 1 to 8, 11 to 13, 17, 19, 20, and 22 to 29, $R_1$ is selected from the group of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, $R_2$ to $R_{13}$, $R_{16}$ to $R_{18}$, $R_{21}$ to $R_{29}$, $R_{35}$ to $R_{36}$, $R_{39}$ to $R_{43}$, $R_{46}$ to $R_{73}$, and $R_{75}$ to $R_{76}$ each independently include at least one selected from the group of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, and $n_1$ to $n_{13}$, $n_{16}$ to $n_{18}$, $n_{21}$ to $n_{29}$, $n_{35}$ to $n_{36}$, $n_{39}$ to $n_{43}$, $n_{46}$ to $n_{63}$, and $n_{65}$ to $n_{71}$ are each independently integers of 0 to 5.

2. A pyrrole compound for an organic photoelectric device, the pyrrole compound being represented by the following General Formula 1:

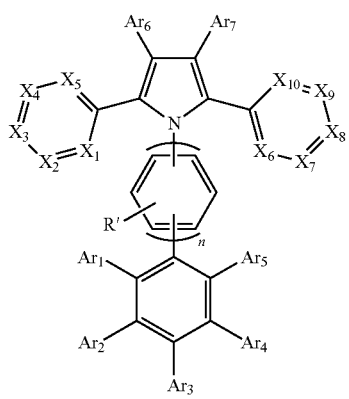

General Formula 1 wherein, in General Formula 1,

R' includes at least one selected from the group of hydrogen and a C1 to C6 alkyl, $Ar_1$ to $Ar_5$ each independently include at least one selected from the group of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, provided that $Ar_1$ to $Ar_5$ are neither a pyridyl group nor a pyrrole derivative group, $Ar_6$ and $Ar_7$ each independently include at least one selected from the group of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, $X_1$ to $X_{10}$ each independently include one selected from the group of CR'' and N, where R'' includes at least one of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, n is an integer of 1 or 2, at least one of $Ar_1$ to $Ar_5$ includes at least one selected from the group of a substituted or unsubstituted carbazolyl; a substituted or unsubstituted arylamino; a substituted or unsubstituted phenyl; a substituted or unsubstituted tolyl; a substituted or unsubstituted naphthyl; a substituted or unsubstituted stilbenzyl; a substituted or unsubstituted fluorenyl; a substituted or unsubstituted anthracenyl; a substituted or unsubstituted terphenyl; a substituted or unsubstituted pyrenyl; a substituted or unsubstituted diphenylanthracenyl; a substituted or unsubstituted dinaphthylanthracenyl; a substituted or unsubstituted pentacenyl; a substituted or unsubstituted bromophenyl; a substituted or unsubstituted hydroxyphenyl; a substituted or unsubstituted thienyl; a substituted or unsubstituted azobenzenyl; and a substituted or unsubstituted ferrocenyl, and at least one of $Ar_6$ and $Ar_7$ includes at least one selected from the group of a substituted or unsubstituted carbazolyl; a substituted or unsubstituted arylamino; a substituted or unsubstituted phenyl; a substituted or unsubstituted tolyl; a substituted or unsubstituted naphthyl; a substituted or unsubstituted stilbenzyl; a substituted or unsubstituted fluorenyl; a substituted or unsubstituted anthracenyl; a substituted or unsubstituted terphenyl; a substituted or unsubstituted pyrenyl; a substituted or unsubstituted diphenylanthracenyl; a substituted or unsubstituted dinaphthylanthracenyl; a substituted or unsubstituted pentacenyl; a substituted or unsubstituted bromophenyl; a substituted or unsubstituted hydroxyphenyl; a substituted or unsubstituted thienyl; a substituted or unsubstituted pyridyl; a substituted or unsubstituted azobenzenyl; and a substituted or unsubstituted ferrocenyl.

3. The pyrrole compound as claimed in claim 1, wherein in the General Formula 1, at least one of $Ar_6$ and $Ar_7$ includes at least one moiety represented by one of the following Chemical Formulae 1a to 29a:

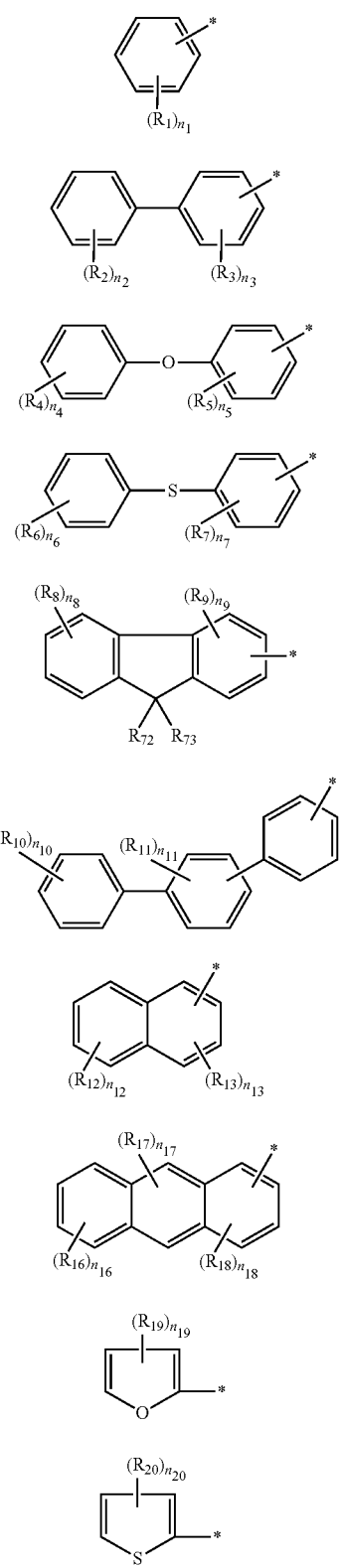

[Chemical Formula 1a]

[Chemical Formula 2a]

[Chemical Formula 3a]

[Chemical Formula 4a]

[Chemical Formula 5a]

[Chemical Formula 6a]

[Chemical Formula 7a]

[Chemical Formula 8a]

[Chemical Formula 9a]

[Chemical Formula 10a]

-continued

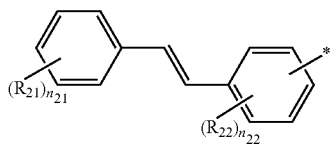

[Chemical Formula 11a]

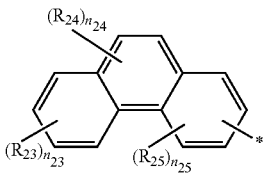

[Chemical Formula 12a]

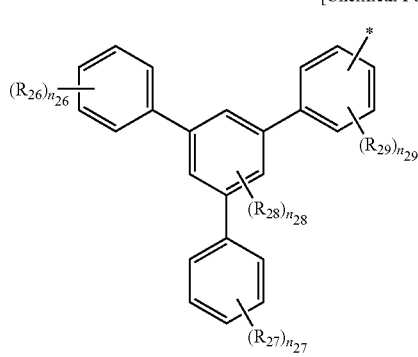

[Chemical Formula 13a]

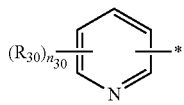

[Chemical Formula 14a]

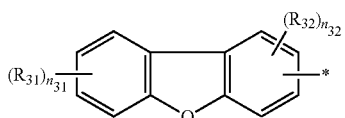

[Chemical Formula 15a]

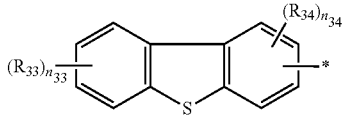

[Chemical Formula 16a]

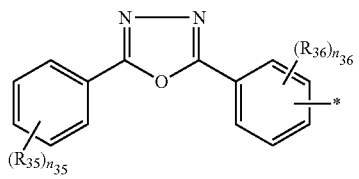

[Chemical Formula 17a]

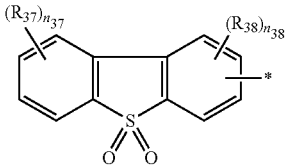

[Chemical Formula 18a]

-continued
[Chemical Formula 19a]
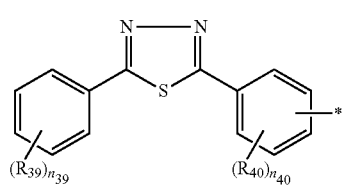
[Chemical Formula 20a]
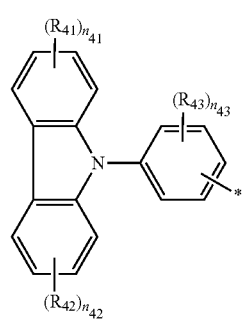
[Chemical Formula 21a]
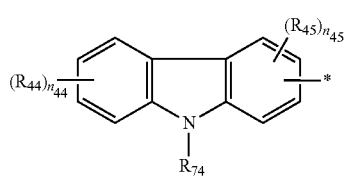
[Chemical Formula 22a]
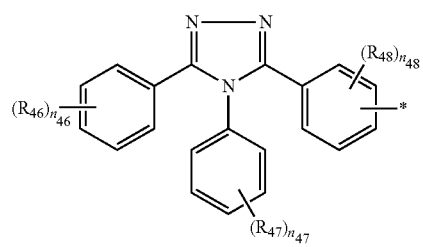
[Chemical Formula 23a]
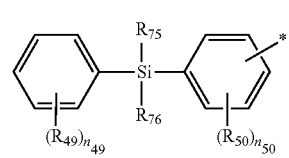
[Chemical Formula 24a]
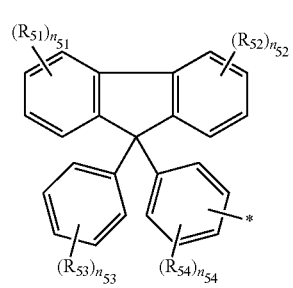
-continued
[Chemical Formula 25a]
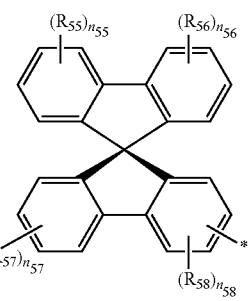
[Chemical Formula 26a]
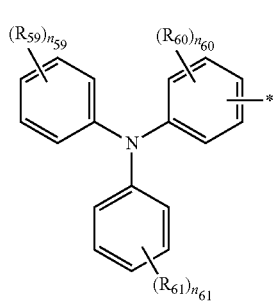
[Chemical Formula 27a]
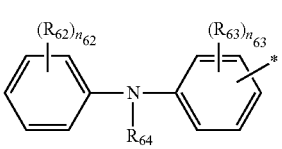
[Chemical Formula 28a]
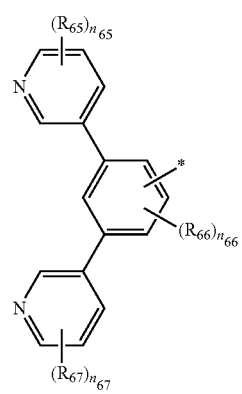
[Chemical Formula 29a]
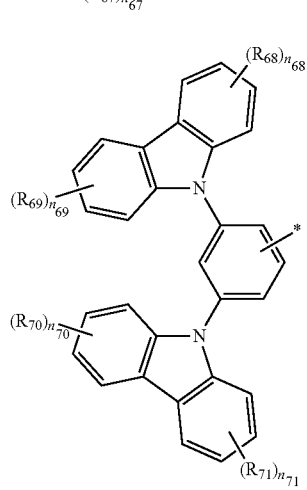

wherein, in the above Chemical Formulae 1a to 29a,

R$_1$ to R$_{13}$ and R$_{16}$ to R$_{76}$ each independently include at least one selected from the group of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, and n$_1$ to n$_{13}$, n$_{16}$ to n$_{63}$, and n$_{65}$ to n$_{71}$ are each independently integers of 0 to 5.

4. The pyrrole compound as claimed in claim 1, wherein the pyrrole compound is a host material or a charge transport material.

5. The pyrrole compound as claimed in claim 1, wherein the pyrrole compound has a maximum light emitting wavelength of about 320 to about 500 nm.

6. The pyrrole compound as claimed in claim 1, wherein the pyrrole compound has triplet excitation energy (T1) of about 2.0 eV or more.

7. An organic photoelectric device, comprising:
an anode,
a cathode, and
at least one organic thin layer between the anode and cathode, wherein the at least one organic thin layer includes the pyrrole compound as claimed in claim 1.

8. The organic photoelectric device as claimed in claim 7, wherein the organic thin layer is an emission layer.

9. The organic photoelectric device as claimed in claim 7, wherein the organic thin layer includes at least one selected from the group of a hole injection layer (HIL), a hole transport layer (HTL), and a hole blocking layer.

10. The organic photoelectric device as claimed in claim 7, wherein the organic thin layer includes at least one selected from the group of an electron injection layer (EIL), an electron transport layer (ETL), and an electron blocking layer.

11. The pyrrole compound as claimed in claim 1, wherein the pyrrole compound represented by General Formula 1 is represented by Chemical Formula 30, below:

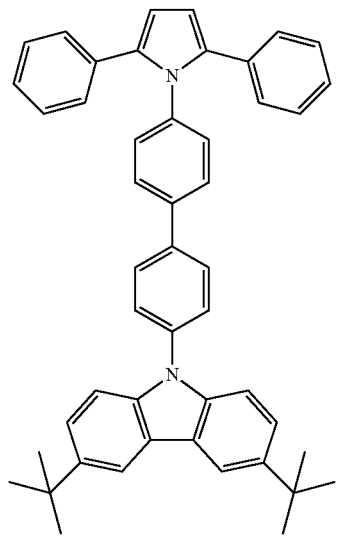

12. The pyrrole compound as claimed in claim 1, wherein Ar$_3$ includes the moiety represented by Chemical Formula 20.

13. The pyrrole compound as claimed in claim 1, wherein at least one of Ar$_1$ to Ar$_5$ includes a heteroaryl ring having at least 6 atoms in the heteroaryl ring.

14. The pyrrole compound as claimed in claim 1, wherein at least one of Ar$_1$ to Ar$_5$ includes a substituted or unsubstituted carbazolyl.

15. A pyrrole compound for an organic photoelectric device, the pyrrole compound being represented by the following General Formula 1:

General Formula 1

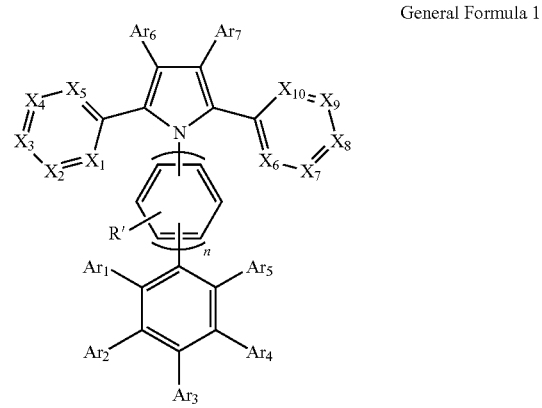

wherein, in General Formula 1,

R' includes at least one selected from the group of hydrogen and a C1 to C6 alkyl, Ar$_1$ to Ar$_5$ each independently include at least one selected from the group of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy;

a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, provided that $Ar_1$ to $Ar_5$ are neither a pyridyl group nor a pyrrole derivative group, $Ar_6$ and $Ar_7$ each independently include at least one selected from the group of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, $X_1$ to $X_{10}$ each independently include one selected from the group of CR" and N, where R" includes at least one of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide; a substituted or unsubstituted C1 to C20 phosphoric acid amide; and a substituted or unsubstituted C3 to C40 silyl, n is an integer of 1 or 2, at least one of $Ar_1$ to $Ar_7$ includes at least one moiety represented by one of the following Chemical Formulae 9, 10, 15, 16, 18, and 21:

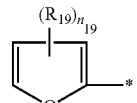

[Chemical Formula 9]

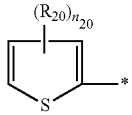

[Chemical Formula 10]

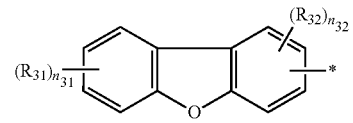

[Chemical Formula 15]

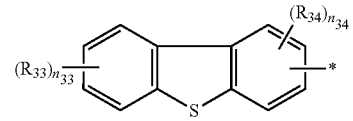

[Chemical Formula 16]

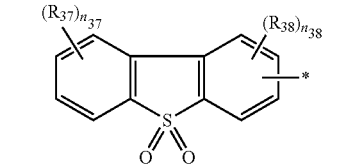

[Chemical Formula 18]

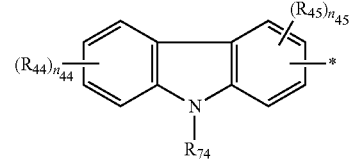

[Chemical Formula 21]

wherein, in the above Chemical Formulae 9, 10, 15, 16, 18, and 21, $R_{19}$, $R_{20}$, $R_{31}$, $R_{32}$, $R_{33}$, $R_{34}$, $R_{37}$, $R_{38}$, $R_{44}$, and $R_{45}$, each independently include at least one selected from the group of hydrogen; a halogen; a cyano; a hydroxyl; a substituted or unsubstituted C1 to C20 amino; a nitro; a carboxyl; a ferrocenyl; a substituted or unsubstituted C1 to C20 alkyl; a substituted or unsubstituted C2 to C20 alkenyl; a substituted or unsubstituted C6 to C30 aryl; a substituted or unsubstituted C2 to C30 heteroaryl; a substituted or unsubstituted C1 to C20 alkoxy; a substituted or unsubstituted C6 to C20 aryloxy; a substituted or unsubstituted C3 to C40 silyloxy; a substituted or unsubstituted C1 to C20 acyl; a substituted or unsubstituted C2 to C20 alkoxycarbonyl; a substituted or unsubstituted C2 to C20 acyloxy; a substituted or unsubstituted C2 to C20 acylamino; a substituted or unsubstituted C2 to C20 alkoxycarbonylamino; a substituted or unsubstituted C7 to C20 aryloxycarbonylamino; a substituted or unsubstituted C1 to C20 sulfamoylamino; a substituted or unsubstituted C1 to C20 sulfonyl; a substituted or unsubstituted C1 to C20 alkylthiol; a substituted or unsubstituted C6 to C20 arylthiol; a substituted or unsubstituted C1 to C20 heterocyclothiol; a substituted or unsubstituted C1 to C20 ureide;

a substituted or unsubstituted C1 to C20 phosphoric acid amide; and a substituted or unsubstituted C3 to C40 silyl, and $n_{19}$, $n_{20}$, $n_{31}$, $n_{32}$, $n_{33}$, $n_{34}$, $n_{37}$, $n_{38}$, $n_{44}$, and $n_{45}$ are each independently integers of 0 to 5.

16. An organic photoelectric device, comprising:

an anode, a cathode, and at least one organic thin layer between the anode and cathode, wherein the at least one organic thin layer includes the pyrrole compound as claimed in claim 15.

17. The pyrrole compound as claimed in claim 1, wherein at least one of $Ar_1$ to $Ar_5$ is represented by one of Chemical Formulae 2 to 8, 11 to 13, 17, 19, 20, and 22 to 29.

18. The pyrrole compound as claimed in claim 1, wherein at least one of $Ar_1$ to $Ar_5$ is represented by Chemical Formula 20.

19. The pyrrole compound as claimed in claim 1, wherein at least one of $Ar_1$ to $Ar_5$ is represented by Chemical Formula 26.

20. The pyrrole compound as claimed in claim 1, wherein at least one of $Ar_1$ to $Ar_5$ is represented by Chemical Formula 29.

* * * * *